(12) United States Patent
Gomez et al.

(10) Patent No.: US 11,676,636 B2
(45) Date of Patent: Jun. 13, 2023

(54) SCALABLE STORAGE DEVICE

(71) Applicant: Seagate Technology LLC, Fremont, CA (US)

(72) Inventors: Kevin A. Gomez, Eden Prairie, MN (US); Dan Mohr, St. Paul, MN (US); Daniel Joseph Klemme, Robbinsdale, MN (US); Aditya Jain, Minneapolis, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 264 days.

(21) Appl. No.: 17/008,208

(22) Filed: Aug. 31, 2020

(65) Prior Publication Data

US 2021/0074326 A1 Mar. 11, 2021
US 2022/0293132 A9 Sep. 15, 2022

Related U.S. Application Data

(60) Provisional application No. 62/896,476, filed on Sep. 5, 2019.

(51) Int. Cl.
| | |
|---|---|
| *G11C 13/04* | (2006.01) |
| *G11B 20/10* | (2006.01) |
| *G11B 20/12* | (2006.01) |
| *G11B 20/18* | (2006.01) |

(52) U.S. Cl.
CPC .. *G11B 20/10259* (2013.01); *G11B 20/10462* (2013.01); *G11B 20/1217* (2013.01); *G11B 20/1803* (2013.01); *G11C 13/04* (2013.01); *G11B 2020/1237* (2013.01)

(58) Field of Classification Search
CPC ..................................................... G11C 13/04
See application file for complete search history.

(56) References Cited

U.S. PATENT DOCUMENTS

| | | | | |
|---|---|---|---|---|
| 8,059,443 | B2 * | 11/2011 | McLaren | G11C 5/025 |
| | | | | 365/230.03 |
| 2005/0058128 | A1 * | 3/2005 | Carson | G06T 9/004 |
| | | | | 370/388 |
| 2020/0081212 | A1 * | 3/2020 | Zhou | H01R 13/521 |
| 2021/0118853 | A1 * | 4/2021 | Harris | G11C 5/04 |

\* cited by examiner

*Primary Examiner* — Min Huang
(74) *Attorney, Agent, or Firm* — Holzer Patel Drennan

(57) ABSTRACT

Implementations described and claimed herein provide a high-capacity, high-bandwidth scalable storage device. The scalable storage device includes a layer stack including at least one memory layer and at least one optical control layer positioned adjacent to the memory layer. The memory layer includes a plurality of memory cells and the optical control layer is adapted to receive optically-encoded read/write signals and to effect read and write operations to the plurality of memory cells through an electrical interface.

14 Claims, 17 Drawing Sheets

SCALABLE STORAGE DEVICE

CROSS-REFERENCE TO RELATED APPLICATIONS

The present application claims priority to U.S. provisional patent application Ser. No. 62/896,476, titled "Scalable Storage Device" and filed on Sep. 5, 2019, which is hereby incorporated by reference for all that it discloses or teaches.

BACKGROUND

One factor potentially limiting both storage capacity and read/write throughput in solid state storage devices (SSDs) is the surface real estate of the device on which electrical contacts are formed to facilitate data flows to and from to various storage locations. In addition, read/write throughput (data access speed) of high capacity SSDs may be limited to some extent by the bandwidth of existing optical and coaxial cable networks. For this reason, it is often faster to transport a high capacity storage device from one facility to another than to transmit significant quantities of data through communication networks that rely on optical or radio/microwave techniques. Storage solutions are therefore sought for portable high-capacity devices that offer high read and write speeds.

SUMMARY

Implementations described and claimed herein provide a scalable, high-performance data storage device that includes a layered stack with at least one memory layer including a plurality of memory cells and an optical control layer positioned directly adjacent to the memory layer. The optical control layer is adapted to receive optically-encoded read/write signals and effect read and write operations to the plurality of memory cells through an electrical interface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTIONS

The herein disclosed technology provides a scalable storage device that uses a high-speed optical interface to facilitate reads and writes to solid state storage media. The high-speed optical interface allows for multiple read and/or write signals to be transmitted along a same optical channel while in transit to and from respective storage locations on the storage media. According to one implementation, the storage device includes a plurality of layers arranged in a vertical stack. Within the vertical stack, each pair of adjacent layers comprise a memory layer and an optical layer that provides data access to the memory layer. In different implementations, the vertical stack may include any number of such pairs such that the height of the stack increases along with storage capacity.

According to one implementation, the scalable storage devices disclosed herein have a massive storage capacity, such as up to 10 petabytes (PB), the entirety of which can be read or written in approximately 2 seconds (e.g., a read/write speed of approximately 5 PB/sec). The herein disclosed scalable storage devices are also designed to be portable and lightweight so that they may be easily transported between different data centers where they may be written to or read from at high speeds commensurate with device specifications (e.g., 5 PB/sec) without being hindered by the comparatively much slower data speeds provided by communication networks between such facilities, such as networks that rely on fiber-optic network lines or radio/microwave techniques. According to one implementation, an exemplary storage device with the above exemplary specifications (e.g., 10 PB capacity and a 5 PB/s read/write speed) is much lighter weight than other existing high-capacity storage devices and may, for example, have a weight of approximately 100 grams.

In addition to providing scalable storage devices, the disclosed technology also provides architectural designs for systems that interface directly with the scalable storage devices. For example, the disclosed technology includes a read/write "player" that may reside at a data center and removably couple to individual storage devices that may be transported back and forth between data centers to upload and offload data.

Figure 1:
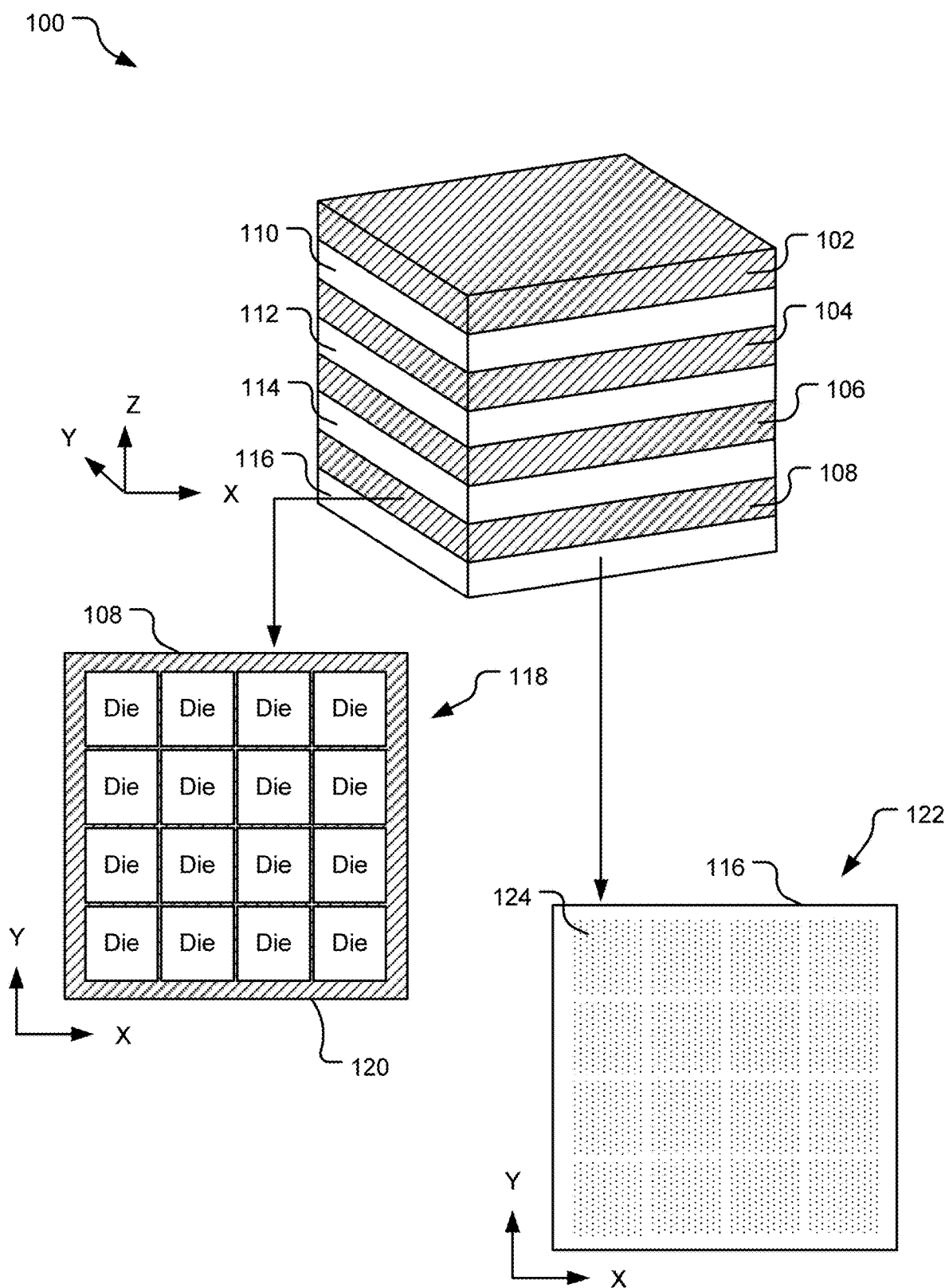
FIG. 1 illustrates an example scalable storage device (e.g., a "storage cube") that includes a layer stack including multiple memory layers and optical control layers.

FIG. 1 illustrates an example scalable storage device 100 that includes a layer stack including multiple memory layers (e.g., memory layers 102, 104, 106, 108) and optical control layers (e.g., optical control layers 110, 112, 114, and 116). Each optical control layer is interleaved between a pair of adjacent memory layers and is adapted to facilitate read and write operations to an immediately adjacent one of the memory layers. As such, each individual pair of adjacent layers (comprising one memory layer and one optical control layer) effectively operates as an independently accessible storage device. For example, the optical control layer 116 facilitates data access to the memory layer 108; the optical control layer 114 facilitates data access to the memory layer 106; the optical control layer 112 facilitates data access to the memory layer 104; and the optical control layer 110 facilitates data access to the memory layer 102. In different implementations, the scalable storage device 100 may include any number of layers ranging from a single layer pair (e.g., one optical control layer and one memory layer) to tens of layer pairs.

Although it is understood that the scalable storage device may be any shape and any number of layers, the various examples shown herein depict the scalable storage device as a cube. Therefore, the term "storage cube" is used herein interchangeably with "scalable storage device."

Although not shown, some implementations of the scalable storage device 100 may utilize a single optical control layer to write to a stack of multiple memory layers. For example, the bilayer structure of FIG. 1 with alternating memory layer and optical control layers may be replaced with a tri-layer structure, quadruple layer structure, etc. such that a single optical control layer provides data access to two or more of the memory layers.

Each of the memory layers (e.g., the memory layer 102) includes several storage cells. In different implementations, the memory layers may comprise one or more of variety of different types of solid state memory including NAND memory, memory devices including complementary metal oxide semiconductors (CMOs), or other emerging memory technologies. By example and without limitation, view 118 illustrates an alternate view of the memory layer 108 that includes multiple rows and columns of memory dice (e.g., a die 120).

In one implementation, the die for memory layer 104 is integrated directly on a layer of semiconductor material, such as a silicon layer, which contains the electrical control circuitry for programming the memory cells within the die to select voltages thereby storing representing ones and zeros of binary data.

View 122 illustrates an alternate view of the optical control layer 116. In one implementation, the control layer includes silicon photonics that provide a high-bandwidth interconnect to the adjacent memory layer. Since each of the optical control layers may be understood as including the same or similar elements, further discussion is directed to the optical control layer 116. Likewise, further discussion of the memory layers is provided with specific reference to the memory layer 108.

In FIG. 1, the optical control layer 116 has a size that is commensurate with (approximately the same as) the associated memory layer 108. The optical control layer 116 includes a number of electrical vias 124 (shown as dots) that are used to transport read data and write data in the Z-axis direction down to underlying associated memory cell locations (specific memory addresses) within the adjacent memory layer 108.

Figure 2:
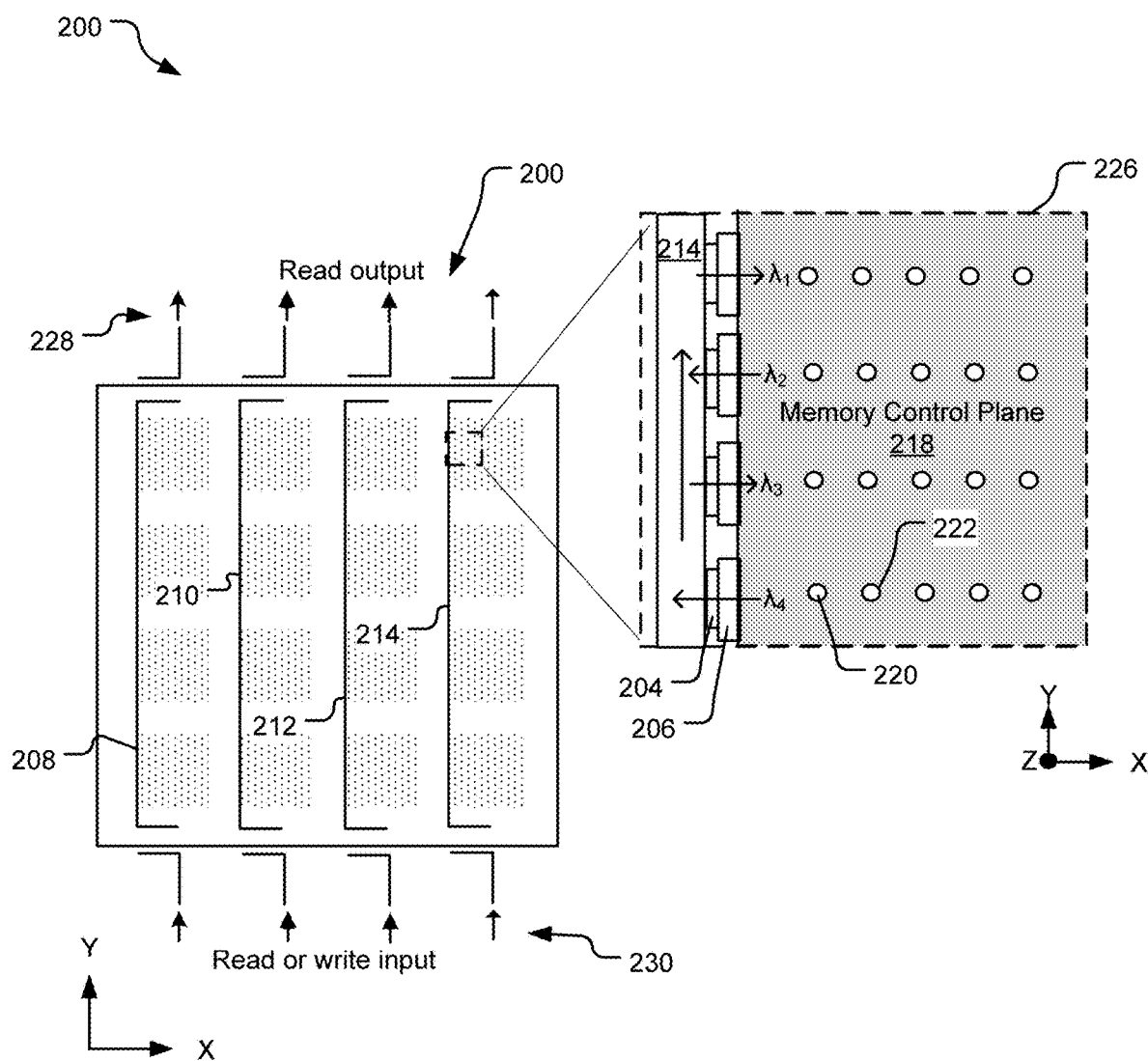
FIG. 2 illustrates an optical control layer suitable for integration within a scalable storage device.
Figure 3:
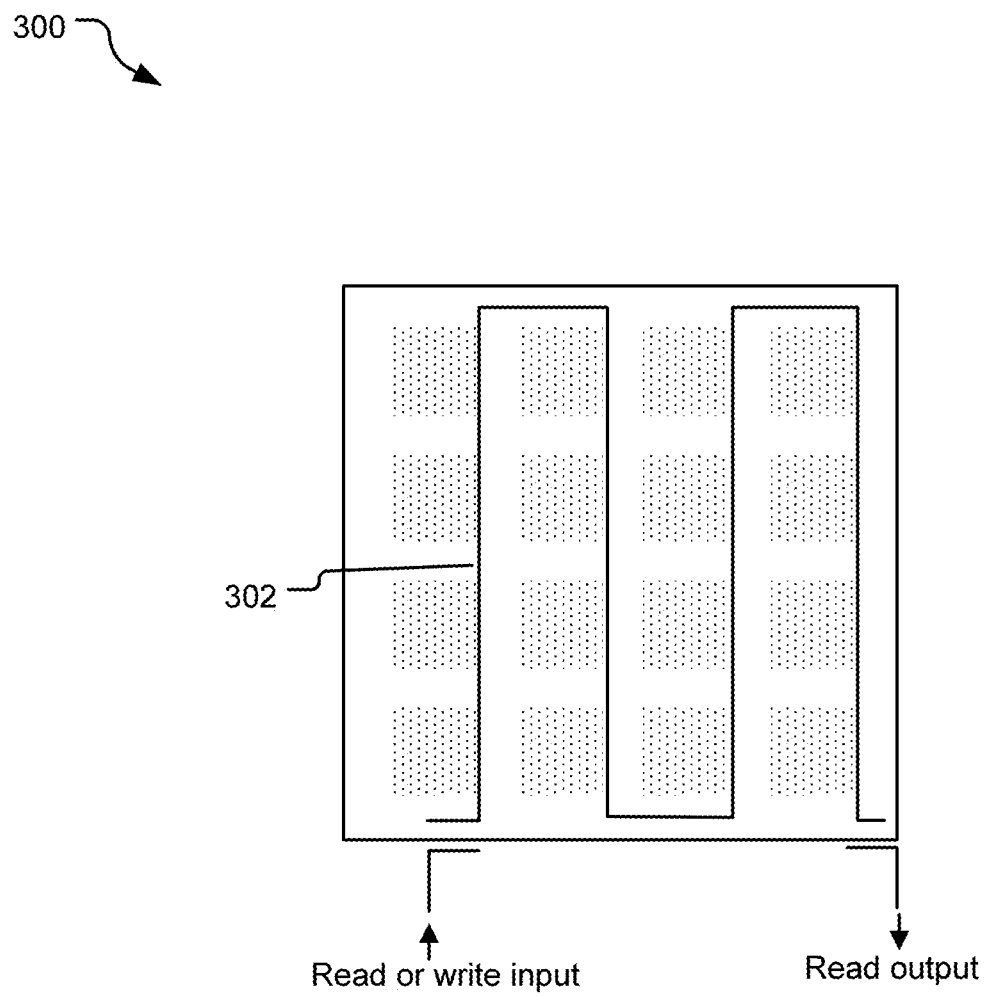
FIG. 3 illustrates another example optical control layer suitable for integration within a scalable storage device.
Figure 4:
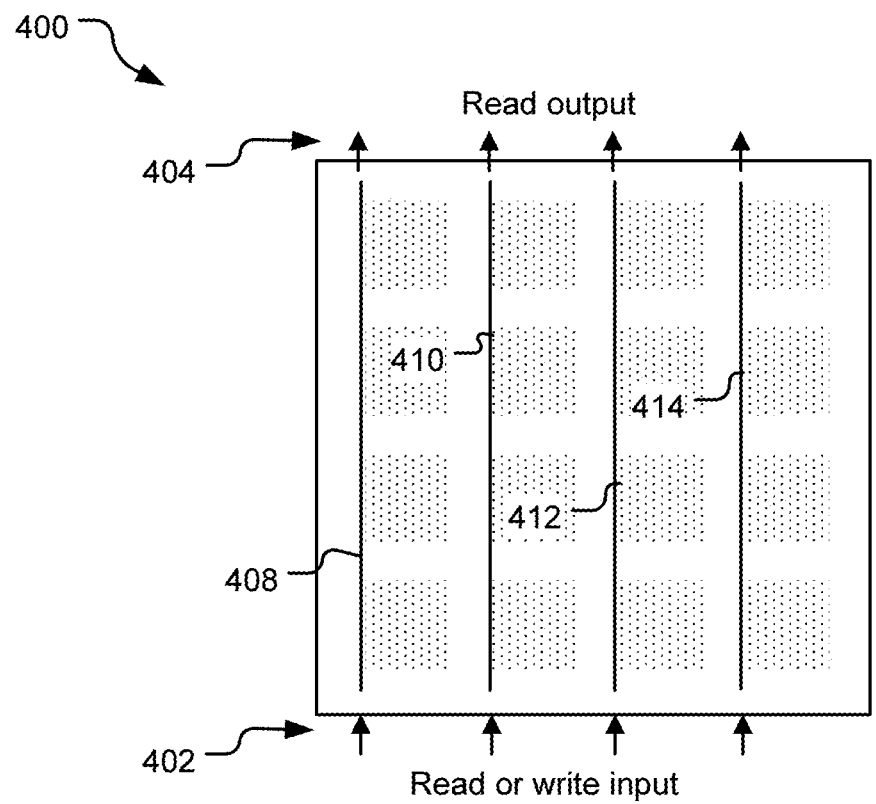
FIG. 4 illustrates yet another example optical control layer suitable for integration within a scalable storage device.
Figure 4:
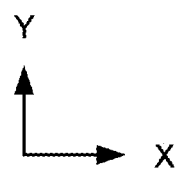

Although not shown in FIG. 1, the optical control layer 116 may include one or more optical channels that transport optical data laterally (e.g., in the X-Y plane), such as in the manner shown in any of FIG. 2-4. The optical channel(s) within the optical control layer 116 are each coupled to a plurality of optical-electric conversion elements. As used herein, an "optical-electric conversion element" refers to an element that is adapted to converted an optical signal to an electrical signal and/or vice versa. For example, the optical control layer 116 may include a plurality of optical-electric conversion elements spread out in the X-Y plane that receive incoming optical signals, convert the optical signals to electrical signals, and provide the converted electrical signals to memory control circuitry that, in turn, executes data access (read and write) operations by routing data down through the electrical vias 124 (e.g., in the Z-axis direction) to respective memory cell locations in the associated underlying memory layer 108.

In the implementation of FIG. 1, the optical control layer 116 may be understood as incorporating both a high-speed optical interface and the electrical control circuitry that writes data to and reads data from the associated memory layer 108. Although the examples shown herein integrate both the high-speed optical interface and the electrical control circuitry for the memory in a single layer (e.g., the optical control layer 116), it may be understood that other implementations include the optical and electrical interface elements in separate layers.

FIG. 2-4 illustrates exemplary optical signal delivery mechanisms within a single individual optical control layer of a scalable storage device. Each of FIGS. 2, 3, and 4 illustrates an exemplary optical control layers that may each be understood as including the same or similar characteristics as the optical control layers described with respect to FIG. 1. An axis labeling (X, Y, Z) used throughout the various figures is intended to match the axis labeling scheme of FIG. 1.

FIG. 2 illustrates an optical control layer 200 suitable for integration within a storage cube such as that shown in FIG. 1. By example and without limitation, the optical control layer 200 includes four bus waveguides 208, 210, 212, and 214 that deliver optical signals to various memory locations on a corresponding underlying memory layer (not shown) in a scalable memory device. By example and without limitation, the four bus waveguides are distributed in the X-axis direction and are each configured to transport optical signals in the Y-axis direction.

To illustrate an exemplary flow of data signals, view 226 illustrates a magnified region of the optical control layer 200. Specifically, the view 226 illustrates a portion of the bus waveguide 214 that transports optical signals in the Y-axis direction. A number of light coupling interfaces (e.g., a light coupling interface 204) are distributed along the Y-axis and are adapted to receive and redirect light of a specific wavelength corresponding to a discrete data stream.

Each light coupling interface 204 is optically coupled to an associated optical-electric conversion element (e.g., an optical-electrical conversion element 206) that is designed to convert an optical signal to an electrical signal and/or convert an electrical signal to an optical signal. For example, the optical-electrical conversion elements that receive incoming write data streams $\lambda_1$ and $\lambda_3$ from the bus waveguide 214 convert optical signals to an electrical signals and the optical-electrical conversion element that receive outgoing read streams $\lambda_2$ and $\lambda_4$ convert electrical signals to optical signals.

The optical-electrical coupling elements are each electrically coupled to a memory control plane 218 that that receives the converted electrical signals and, in return, generates control signals to effect read and write operations by transmitting data down through electrical vias formed in the Z-axis direction to a corresponding memory location (e.g., vias 220, 222).

Notably, the implementation shown in view 226 is one in which read and write signals are encoded at different wavelengths and transported in the same optical channel (bus waveguide 214). Some implementations may provide for independent optical read and write optical channels (e.g., read signals and write signals are transmitted along different bus waveguides).

In the example shown, the bus waveguides 208, 210, 212, and 214 are each evanescently coupled to associated input optical couplings 230 and output optical couplings 228. To establish an evanescent coupling, two waveguides are brought in close proximity of one another. If the waveguides are well-matched, light jumps between the waveguides efficiently at a particular distance. The optical control layer 200 may be formed by a single semiconductor die or multiple If there are multiple dies in the optical memory layer, the dies can be end-coupled to each other to allow light to serially pass through them.

By using multiple optical channels (e.g., four bus waveguides), read/write parallelism can be increased due to the fact that various wavelengths within each of the different optical channels can be associated with discrete memory address ranges.

FIG. 3 illustrates another example optical control layer 300 suitable for integration within a storage cube such as that shown in FIG. 1. Here, the optical control layer 300 includes a single bus waveguide 302 that "snakes" through different regions of the optical control layer to deliver optical signals to respective optical-electrical conversion elements and memory control electronics. Aspects of FIG. 3 not specifically shown may be assumed the same or similar to those described with respect to FIG. 1-2.

In contrast to the implementation of FIG. 2 where different regions of a same memory layer are written to and read out in four different parallel optical streams, the bus waveguide 304 allows the entire associated memory layer to be read and written to using a single optical stream.

In some implementations, the optical control layer 300 comprises multiple different semiconductor dice that are assembled together. In such cases, each "jump" of the optical signal from one die to may accrue losses due to alignment errors. Thus, the more times the optical signals jumps from die to die in an individual bus waveguide, the greater the signal loss. For this reason, the implementation of FIG. 3 may be associated with greater signal losses than those resulting from the implementations discussed with respect to FIG. 2 and FIG. 4 (discussed below). In the implementations of FIG. and 4, the bus waveguide pathlengths are generally shorter than and may therefore traverse fewer "jumps" between different dice than the bus waveguide 302. Notably, however, the implementation of FIG. 3 allows for fewer total optical connections to the optical control layer 300, which may simplify the architecture of systems designed to couple to and read and write from the storage device including the optical control layer 300. By example and without limitation, the input and output optical couplings are shown to be on a same side surface of the optical control layer 300.

FIG. 4 illustrates yet another example optical control layer 400 suitable for integration within a storage cube such as that shown in FIG. 1. Here, the optical control layer 400 is similar to that shown in FIG. 2; however, a different coupling mechanism is used. As opposed to the evanescent coupling described with respect to FIG. 2, the optical inputs 402 and optical outputs 404 are, in FIG. 4, coupled to bus waveguides 408, 410, 412, and 414 using free-space coupling or end/butt coupling. With free-space coupling, light (laser light) is precisely directed and aligned to strike the optical inputs. In one implementation, a tapering or grating structure may be used to help guide the light into the waveguide to increase coupling efficiency. With end or butt coupling, an external waveguide is aligned end-to-end with each one of the bus waveguides 406, 408, 410, 412 in the optical control layer 400 to couple light into the waveguide input. Aspects of the optical control layer 400 not specifically shown or described with respect to FIG. 4 may be assumed the same or similar to other implementations described or illustrated herein.

Figure 5:
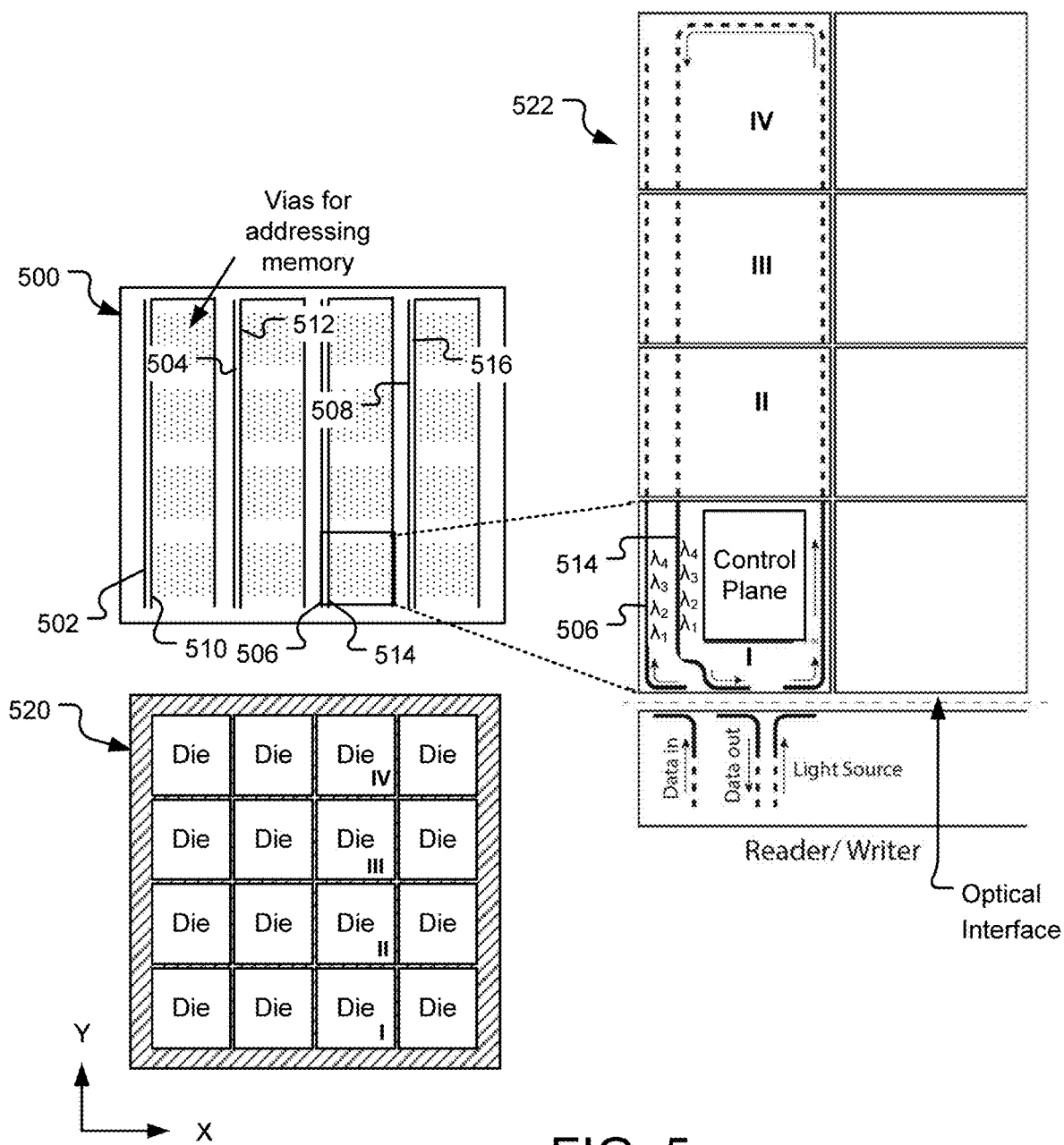
FIG. 5 illustrates still another example optical control layer suitable for integration within a scalable storage device.

FIG. 5 illustrates still another example optical control layer 500 suitable for integration within a storage cube such as that shown in FIG. 1. Here, the optical control layer 500 dedicates separate bus waveguides to data inputs (e.g., carrying read data inputs, write inputs) and data outputs (e.g., read outputs). Data inputs are provided to each of four different "input" waveguides 502, 504, 506, and 508, each providing access to a discrete range of memory addresses on an adjacent memory 520, which may be understood as being a layer within a storage cube that is stacked in a parallel plane directly above or directly below the optical control layer 500. Data outputs are optically encoded by the optical control layer 500 and transmitted out of the storage cube along each of four different "output" waveguides 510, 512, 514, and 516, that are each associated with one of the discrete ranges of memory addresses on the adjacent memory layer 520.

This concept is illustrated in further detail within magnified view 522. Each of the waveguides extends along the length of four different die (labeled I, II, III, IV) in the adjacent memory layer 520. For example, the input waveguide 506 and the output waveguide 516 extend within the optical control layer 500 extend along the length of four die labeled I, II, III, IV in the memory layer 520. These four different die are each spatially adjacent to one of the regions labeled I, II, III, and IV within the optical control layer 500. Further, each of the regions I, II, III, and IV of the optical control layer 500 includes control elements (represented as "control plane"—not shown to scale) that are adapted to intercept optical inputs encoded a selected range of discrete wavelengths. For example, the wavelengths $\lambda_1$, $\lambda_2$, $\lambda_3$, $\lambda_4$ may be used to read and write data to one memory die on the memory layer 520 while an additional, different set of discrete wavelengths may be used to read and write data to each other die on the memory layer 520. In other implementations, fewer or greater than four different wavelengths may be used with respect to read and write data for each individual die.

Within each region on the optical control layer 500 (e.g., regions I, II, III, and IV), control plane elements intercept optical signals of one or more predefined wavelengths that are transmitted along the input waveguide 506. These control elements also encode optical outputs at one or more predefined wavelengths and direct those outputs out of the storage cube along the output waveguide 514, as shown.

While the implementation of FIG. 5 may include a large number of input/output coupling interfaces, this implementation provides greater read/write bandwidth than that available via the implementations of FIG. 2-4 since a read data stream output may, in FIG. 5, share a same wavelength as a write data stream input while still allowing concurrent read/write operations at the respective shared wavelength.

Figure 6:
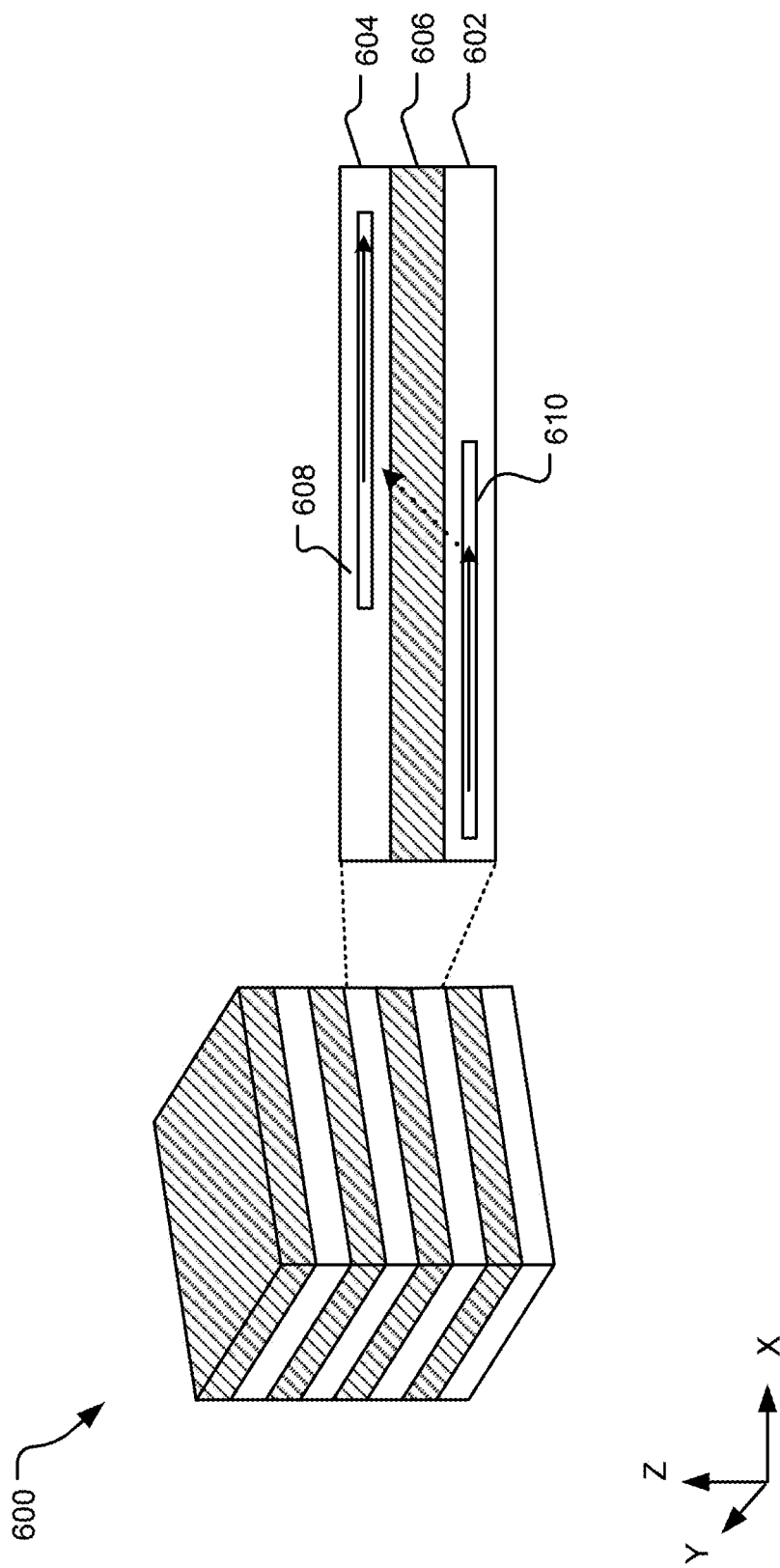
FIG. 6 illustrates example waveguide coupling mechanism usable to transport optical signals between different optical control layers in a scalable storage device.

FIG. 6 illustrates example waveguide coupling mechanism usable to transport optical signals in a storage cube 600, which may be understood as having characteristics the same or similar as those described with respect to other figures disclosed herein. While FIG. 2-5 illustrate exemplary bus waveguides that transport light throughout a single optical layer (e.g., an optical control layer 602), FIG. 6 instead illustrates one example means for transporting optical signals between two adjacent optical control layers 602 and 604 and through memory layer 606.

In the illustrated example, the optical control layer 602 transports light along a bus waveguide 610. The light in the bus waveguide 610 is then coupled into another bus waveguide 608 in the adjacent optical control layer 604, through the memory layer 606. In the illustrated implementation, the bus waveguide 610 and 608 are evanescently coupled. If the two layers are separated by a large distance (e.g., because the memory layer 606 is especially thick), adequate coupling efficiency between the two waveguides may limited to systems that can provide for low signal losses and a long interaction length between the light within the bus waveguides 608 and 610. In situations where evanescence coupling efficiency is inadequate (e.g., due to a thicker memory layer 606, higher signal losses and/or shorter available interaction length), other layer-to-layer (e.g., z-direction) coupling mechanisms (couplers) may be used to assist in guiding the light. Two example couplers are described below with respect to FIGS. 7 and 8.

Figure 7:
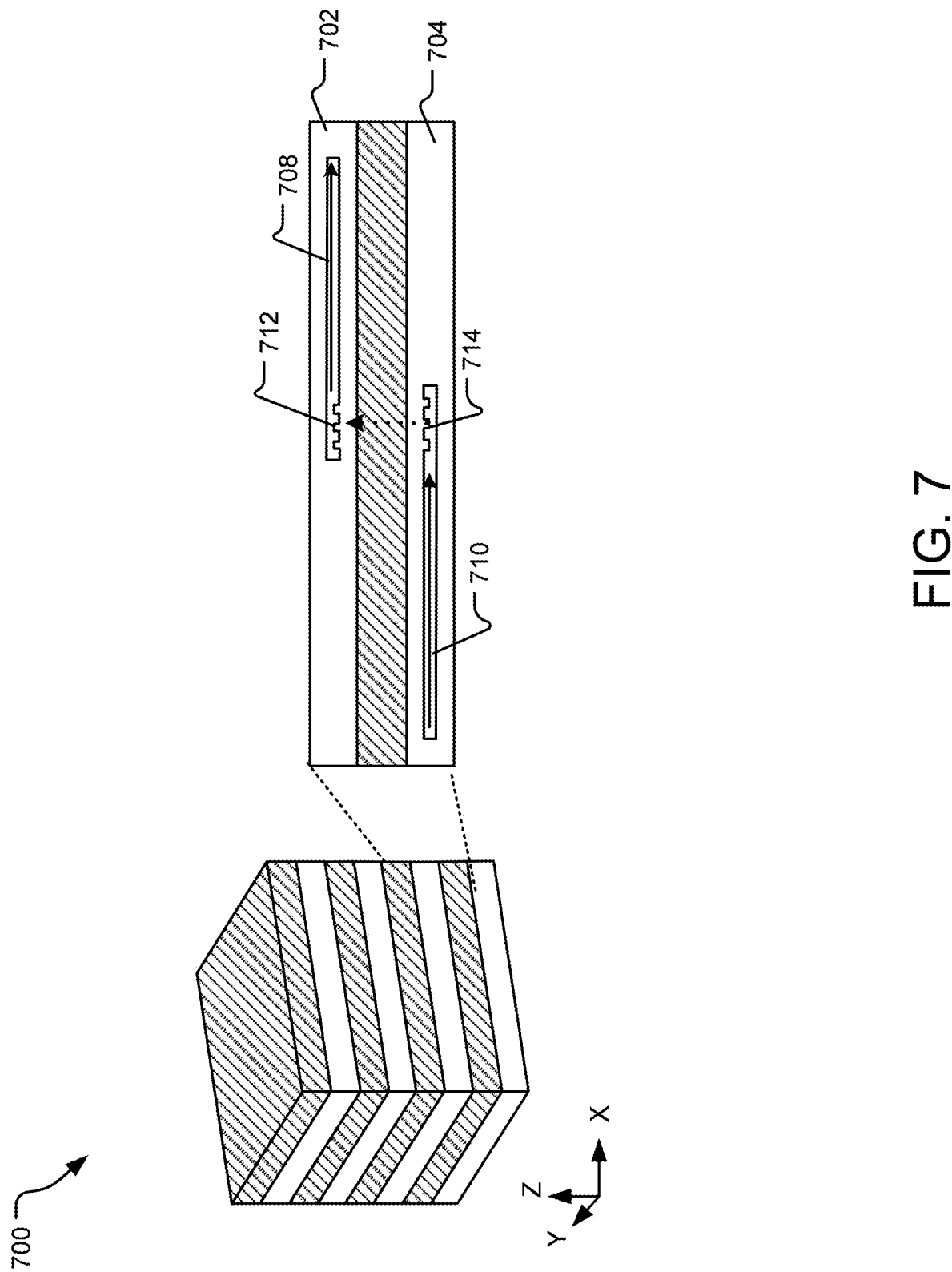
FIG. 7 illustrates another example waveguide coupling mechanism usable to transport optical signals across different optical control layers in a scalable storage device.

FIG. 7 illustrates another example waveguide coupling mechanism usable to transport optical signals across different optical control layers in a storage cube 700. In contrast to the evanescent coupling technique of FIG. 6, FIG. 7 illustrates gratings 712, 714 within bus waveguides 708 and 710 of adjacent optical control layers 702 and 704. In one implementation, the gratings 712, 712 are designed to be directional in that they each emit and collect light in a direction that is orthogonal to the direction of signal propagation within the bus waveguides 708 and 710.

Aspects of the storage cube 700 not specifically discussed with respect to FIG. 7 may be the same or similar to other implementations disclosed herein.

Figure 8:
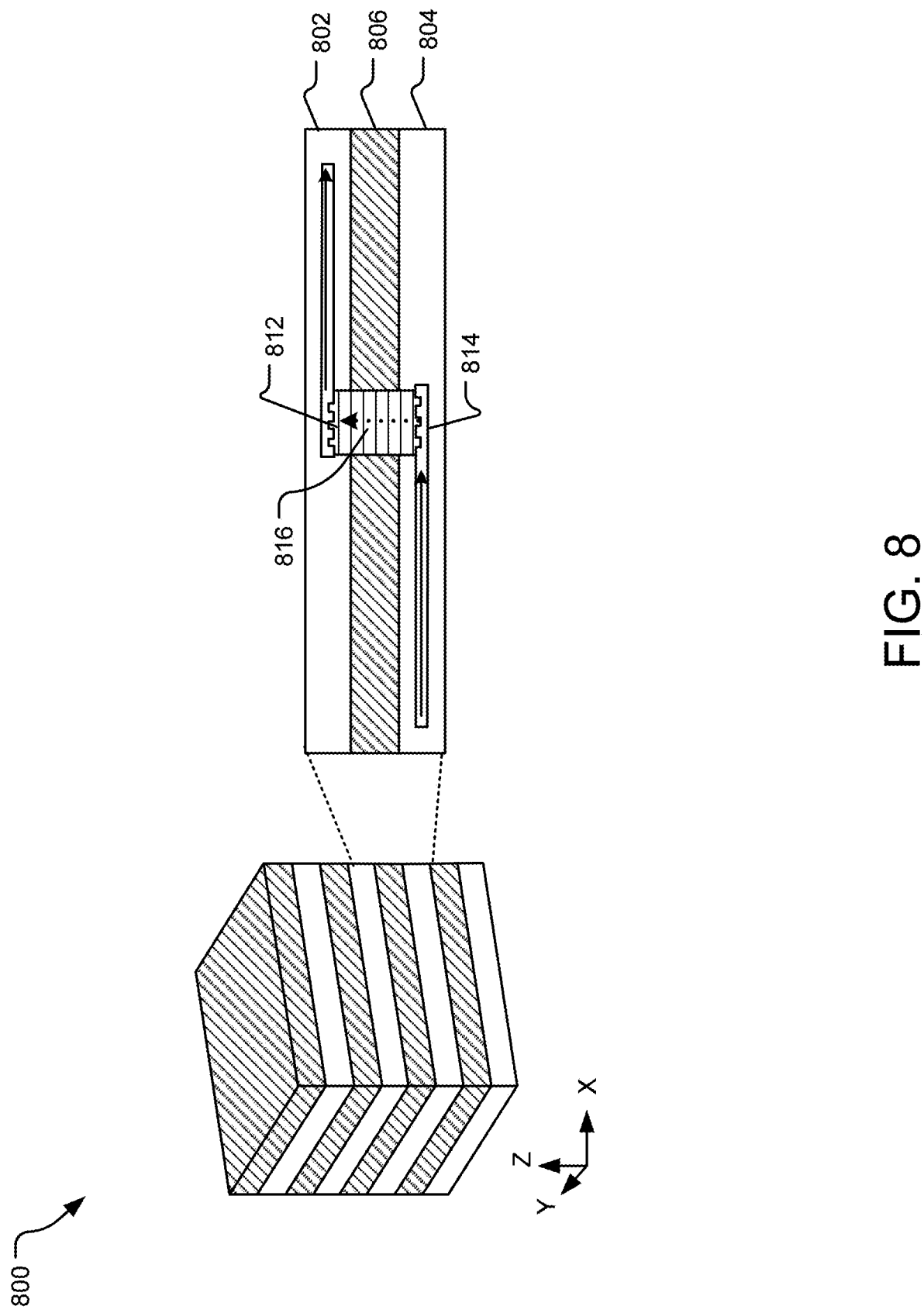
FIG. 8 illustrates still another example waveguide coupling mechanism usable to transport optical signals across different optical control layers in a scalable storage device.

FIG. 8 illustrates another example waveguide coupling mechanism usable to transport optical signals across different optical control layers in a storage cube 800. The design of FIG. 8 differs from that of FIG. 7 in that a coupling between two gratings 812, 814 is, in FIG. 8, further assisted by directing optical signals through a dedicated channel 816 that may help to reduce optical loss. For example, the channel 816 may be etched through optical control layers 802, 804, and memory layer 806, and then back-filled with a suitable waveguide structure with high-index core and low-index cladding that is effective to guide the propagation of light between the optical control layers 802 and 804. Aspects of the storage cube 800 not specifically discussed with respect to FIG. 8 may be the same or similar to other implementations disclosed herein.

Notably, all of the above described layer-to-layer waveguide coupling techniques in FIG. 6-8 may be used to reduce the number of optical connections (e.g., optical inputs and outputs) to the storage cube without a cost in storage capacity. In some implementations, there may exist a greater number of optical control layers in the storage cube than there are optical input/output pairs.

Figure 9:
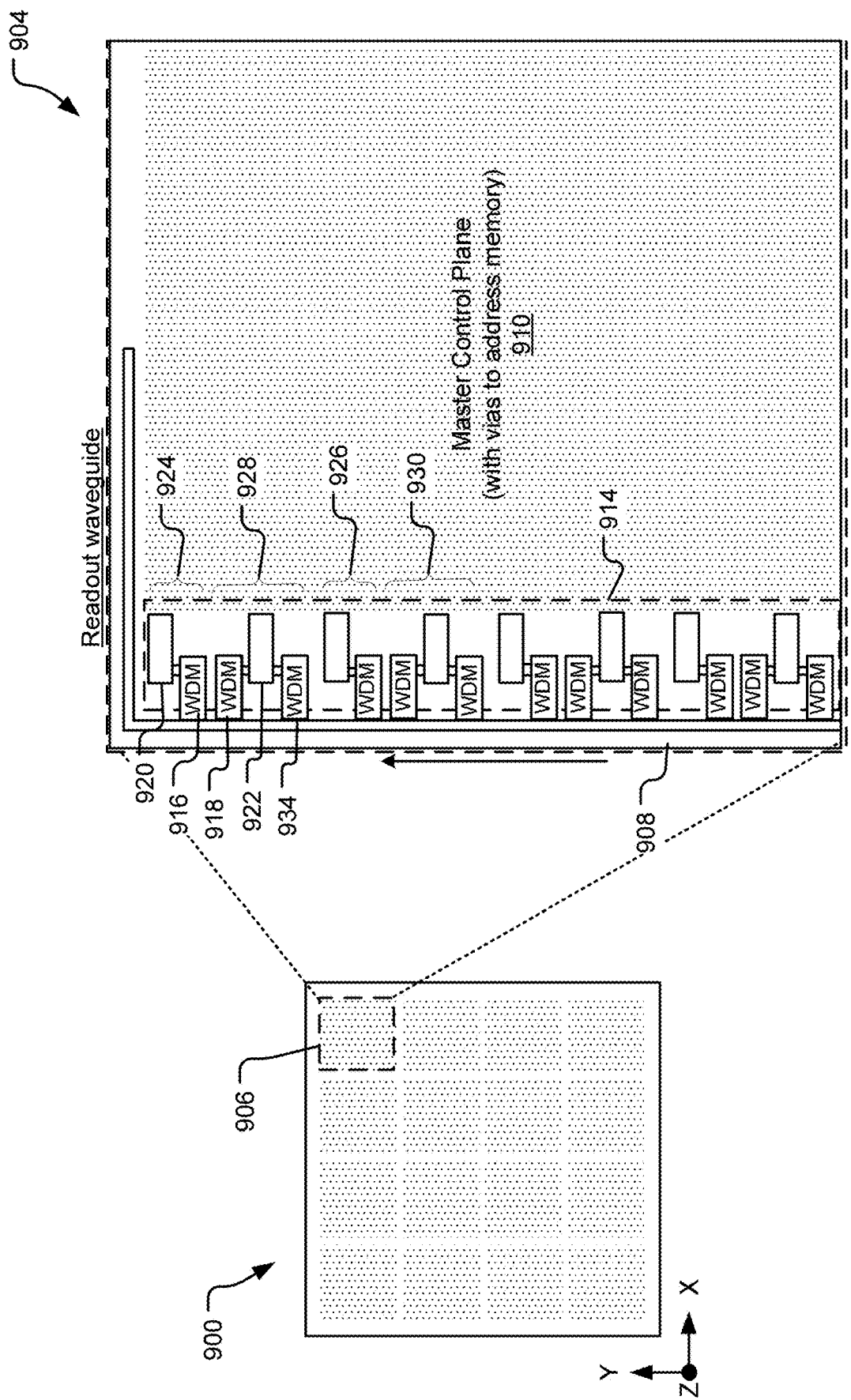
FIG. 9 illustrates aspects of another example optical control layer suitable for implementation within a scalable multi-layer storage device.

FIG. 9 illustrates aspects of another example optical control layer 900 suitable for implementation within a scalable multi-layer storage device. In one implementation, the optical control layer 900 is stacked adjacent to and in contact with a memory layer of approximately the same X/Y dimensions (e.g., as shown in FIG. 1), such that each of the two layers extend to define parallel planes in the stack.

By example and without limitation, expanded view 904 illustrates components within a region 906 of the optical control layer 902. In one implementation, the region 906 represents an individual die and the optical control layer 902 includes multiple dice (e.g., a 4×4 matrix of dice in the illustrated implementation) that are assembled together on a same substrate.

Referring to the expanded view 904, the optical control layer 902 is shown to include a bus waveguide 908 that transports optical signals in the Y-axis direction. The optical control layer 902 includes a master control plane 910 with a number of vias (indicated by dotted texture) that extend in the Z-axis direction (e.g., into the page). These vias provide connections to various individual memory locations (different physical memory addresses) within an adjacent memory layer at which data may be read from or written to.

Optical signals encoding read/write commands and data are transmitted along the bus waveguide 908 and directed through an interface region 914 toward the master control plane 910. By example and without limitation, the interface region 914 is shown to include elements that direct signals in an X-axis direction generally perpendicular to the direction of optical signal transport within the bus waveguide 908.

Specifically, the interface region 914 includes a number of tunable wavelength division multiplexers (WDMs 916, 918) that couple to the bus waveguide 908 at various locations distributed along the length of the waveguide. Each WDM 916, 918, etc. is tuned to intercept optical signals of a predefined wavelength. Thus, each of the WDMs shown in FIG. 2 may be tuned to "listen for" and intercept a different select wavelength of light from the bus waveguide 908.

Each of the WDMs is optically coupled to an associated optical-electric conversion element (e.g., optical-electric conversion elements 920, 922) that is adapted to convert a modulated optical signal to an electrical signal (e.g., using a photoelectric detector) or vice versa (e.g., using a read modulator). Each WDM and its associated optical-electric conversion element is dedicated to either providing inputs from the bus waveguide 908 to the master control plane 910 or providing outputs from the master control plane 910 to the bus waveguide 908.

By example and without implementation, FIG. 9 stages read blocks (e.g., read blocks 928, 930) and write blocks (e.g., write blocks 924, 926) alternatively along the bus waveguide 908. With reference to read block 928, light is sent in through the waveguide 908, coupled with a first WDM 918, and directed into a read modulator (e.g., the optical-electric conversion element 922). Once the specified data is read from memory, the optical-electric conversion element 922 sends the modulated light (encoded with the stored read information) to a second WDM 934 in the read block 928 to couple it back out of the storage device. During a write operation to the write block 924, light is sent in through the waveguide 908 and coupled into the WDM 916, which directs the encoded write data at a photodetector (e.g., the optical-electric conversion element 922) that in turn couples the light into an electric signal that may be written to the encoded specified memory locations. In other implementations, the input optical blocks and output optical blocks may be arranged differently.

Notably, in some implementations, a same designated wavelength may be used to encode both read and write inputs associated with a same range of memory addresses. For example, the same wavelength could be used for both read and write operations provided reading and writing are not performed simultaneously for the shared wavelength. For instance, the storage device may be configured to toggle between a "read mode" and a "write mode" for a shared wavelength by temporarily configuring the unused WDMs to listens for an unused wavelength. That is, in "read mode," the write WDMs could be tuned to an unused wavelength so inputs are not received along the associated paths and vice versa in write mode.

In another implementation, each read block (e.g., read blocks 928, 920) and write block (e.g., write blocks 924, 926) on the optical control layer 900 is configured to a discrete different wavelength so as to allow parallel reads and writes to all memory locations regardless of wavelength.

In yet still another implementation, the optical control layer 900 includes two different parallel waveguide buses— one for reading and one for writing. In this scenario, the same wavelength could be used for reading and writing and yet, the read and write operations to shared wavelengths may be performed simultaneously.

Circuitry within the master control plane 910 interprets the electrical signal received from the optical-electric conversion elements (e.g., 920, 922) to effect the read and/or write operations at designated memory locations through the corresponding vias that connect to the associated physical locations in the memory layer (not shown).

In one implementation the bus waveguide 908 transmits both read and write command in data. In another implementation, a first bus waveguides is used to transmit read data and read commands while a second bus waveguide is used to transmit write data and write commands.

The general approach shown by way of FIG. 9 is that a single bus waveguide (908) may transport several different wavelengths of light encoding different signals. Multiplexing is performed by the WDMs (or other components that provide similar functionality), allowing each read and write channel to operate in parallel with all others. In some implementations where read and write operations are not performed simultaneously, a signal read and write pair (or several, in any proportion) may share the same operational wavelength.

In the implementation of FIG. 9, light is simply transmitted through the storage cube for the read operation. Alternatively, it is possible to have lasers or other light sources inside the storage cube to generate light, alleviating the need to apply an external light source. Aspects of the storage cube 800 not specifically discussed with respect to FIG. 8 may be the same or similar to other implementations disclosed herein.

Figure 10:
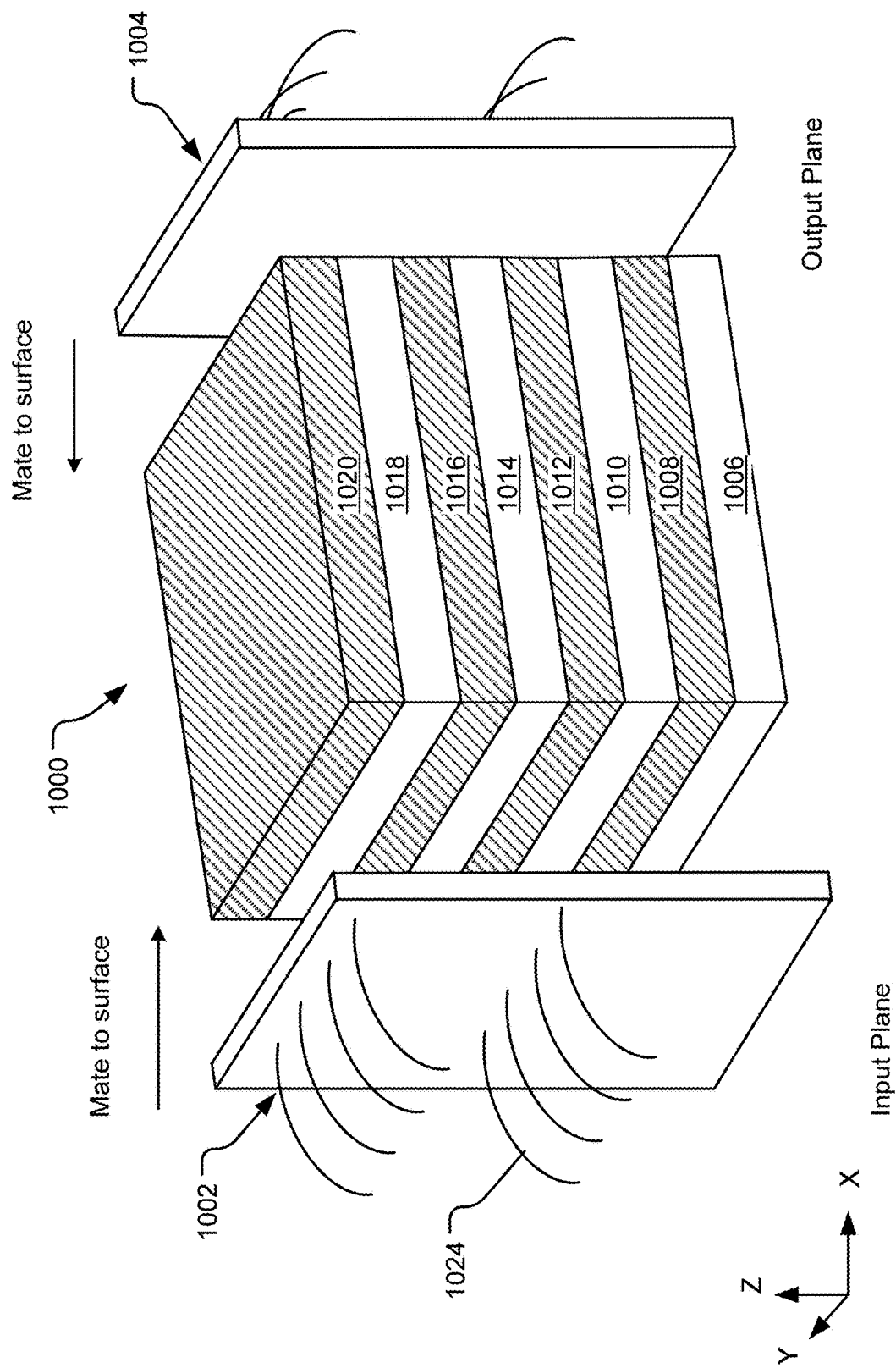
FIG. 10 illustrates example read/write player components that may be designed to couple with a scalable storage device.

FIG. 10 illustrates example read/write player components that may be designed to couple with a storage cube 1000. The storage cube 1000 includes a layer stack of alternating memory layers (e.g., memory layer 1008, 1012, 1016, 1020) and optical control layers (e.g., optical control layers 1006, 1010, 1014, 1018). Optical inputs to the storage cube 1000, such as write data and commands, are provided by an input plane 1002. An output plane 1004 the receives outgoing optical signals, such as read data and other data that is output from the storage cube 1000. Transmission of optical signals between the input plane 1002, storage cube 1000 and output plane 1004 may be accomplished using fiber optic lines and coupling elements, lasers, or any suitable light coupling configuration.

By example and without limitation, the input plane 1002 and output plane 1004 are shown providing optical inputs to two of the four total optical control layers (e.g., optical control layers 1018 and 1010 receive optical inputs). In this implementation, the optical signals transported via the inputs and outputs are propagated vertically (e.g., in the Z-axis direction) within the storage cube 1000 between adjacent optical control layers within the layer stack, such as in the manner shown with respect to any of FIG. 6-8.

In one implementation, the input plane 1002 and output plane 1004 are located within an apparatus, enclosure, or structure that is designed to removably couple to the storage cube 1000. When the storage cube 1000 is initially positioned between the input plane 1002 and the output plane 1004, operations are performed to precisely align the optical inputs and optical outputs with bus waveguides included in the storage cube. This alignment may be performed using a variety of techniques including without limitation techniques that utilize feedback (e.g., optical feedback, waveguide feedback, electrical feedback, magnetic feedback, etc.) to verify accurate alignment. Optical coupling between the optical transmission lines of the storage cube 1000 and those on the input plane 1002 and the output plane 1004 may, in different implementations, be accomplished in a variety of different ways such as via evanescent couplings or those that rely on coupling elements (e.g., end-coupling or butt-coupling). Each optical input/output coupling to the storage cube 1000 may utilize a multi-core fiber or any other suitable method to join a fiber to a wafer.

Although the implementation of FIG. 10 includes fiber optic elements to direct the signals into the storage cube, other implementations may not. For example, the input plane 1002 may instead include laser output elements adapted to precisely direct a laser beam through free space and into an associated bus waveguide of the storage cube without using a fiber optic medium to facilitate the connection.

It should be understood that the precise number and arrangement of optical inputs and outputs on the input plane 1002 and output plane 1004 depends upon the specific bus waveguide layout without the storage cube 1000 and may vary widely from one implementation to another. In some implementations, such as that described with respect to FIG. 11, below, the input plane 1002 and output plane 1004 includes coupling and multiplexing elements so as to "split" the each of the illustrated optical inputs (e.g., optical input 1024) into multiple subcomponent streams that may then be directed through different bus waveguides.

Figure 11:
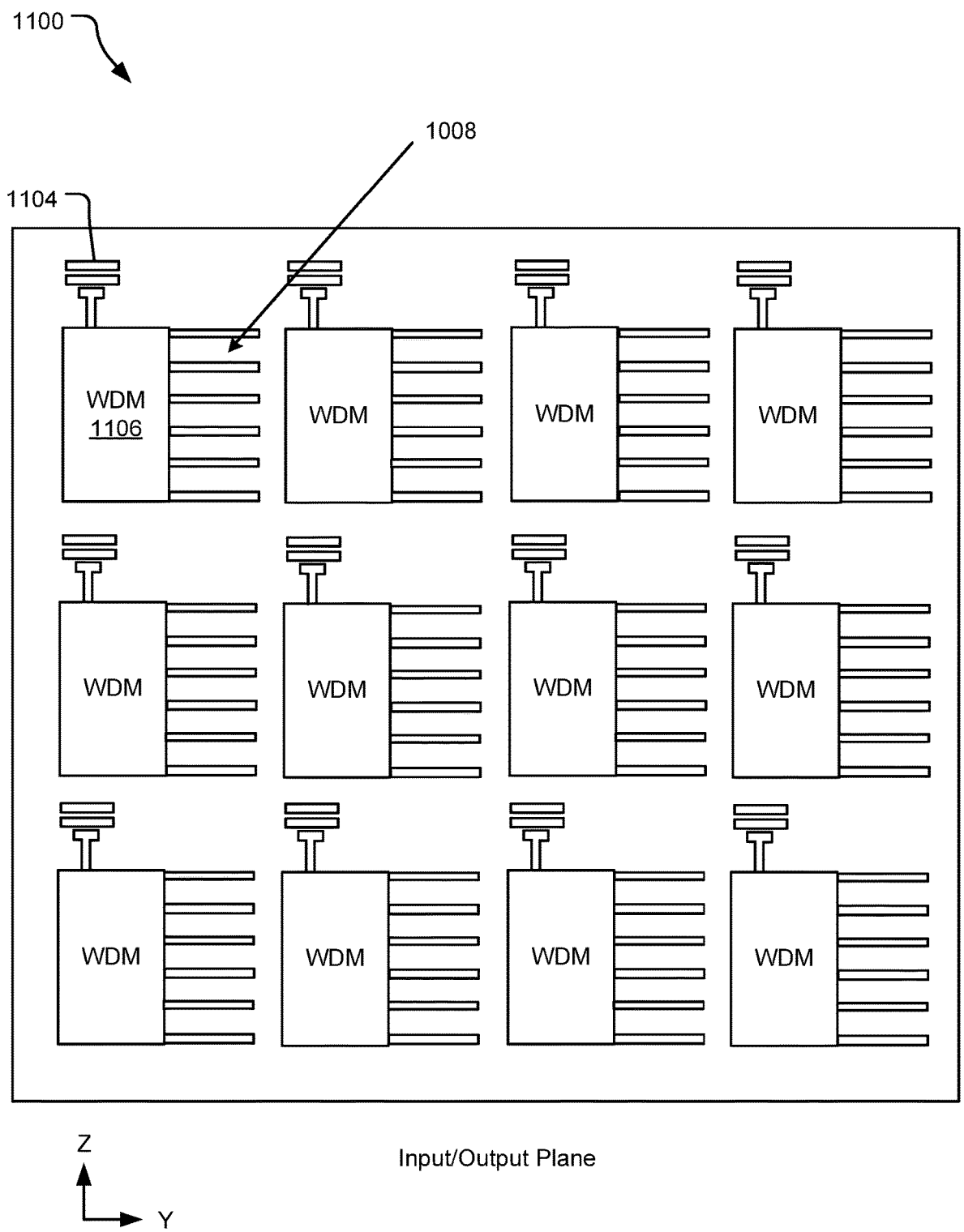
FIG. 11 illustrates a side view of an example input/output plane that may integrated within a read/write player that is designed to mate with a storage cube.

FIG. 11 illustrates a side view of an example input/output plane 1100 that may integrated within a read/write player that is designed to mate with a storage cube. The term "input/output plane" is used herein to refer to any of an input plane, output plane, or a plane that includes both inputs and outputs. The Y-Z axis key is intended to reference the corresponding Y and Z axis shown in FIG. 10.

The input/output plane 1100 may correspond to either the input plane 1002 of FIG. 10 or the output plane 1004 of FIG. 10 or to a similar plane designed to provide both optical inputs and outputs for a storage cube. While FIG. 10 shows optical fibers feeding into a first surface of the input plane 1002, FIG. 11 is meant to represent components internal to the optical input plane 1002 and/or on the opposite side of the optical input plane 1002 that interface with the storage cube. Each optical fiber shown in FIG. 10 may be understood as connecting to a fiber optic coupler 1104 within the input/output plane 1100. This coupling may be achieved using any suitable coupling technique including evanescent coupling or end/butt coupling. The fiber optic coupler 1104, in turn, connects to a WDM 1106 or other component that selectively routes different optical sub-streams into different respective coupling waveguides 1108. These coupling waveguides 1108 (including 6 individual waveguides) couple the optical signals to the bus waveguides that are integrated within the optical control layers of the storage cube.

Multicore fibers can have a large variety of cores, such as 32 and greater. For simplicity, the input/output plane 1100 is shown with WDMs (e.g., WDM SSS) that split a 6-core multicore fiber onto six respective coupling waveguides. The input/output plane 1100 may be precisely positioned such that each one of the coupling waveguides 1108 is precisely aligned with an optical input to a bus waveguide on the storage cube.

In one implementation, a multi-core optical fiber transports multiple different encoded data streams in each of its different cores. Each different core and/or select wavelengths within the core may be used to transport data to and from a discrete range of addresses in memory. In the simplified case where a multi-core fiber includes six cores (1-6), each core may be understood as transporting a same range of wavelengths that encode different signals (encoded write data or other inputs) associated with different memory address ranges. For example, core 1 may encode different input streams (e.g., write data streams and/or other inputs) at wavelengths $\lambda_1$, $\lambda_2$, $\lambda_3$, etc. that each correspond to a discrete memory address range (e.g., LBA 100-199, 200-299, 300-399), while core 2 encodes still another number of different input streams at the same or different wavelengths (e.g., $\lambda_1$, $\lambda_2$, $\lambda_3$, etc.), each corresponding to still other different discrete memory address ranges (e.g., 400-499, 500-599, 600-699, etc.), and so on. Any individual one of the 6 cores output from each WDM may encode read inputs, write inputs, or a combination of read inputs and write inputs. In the case that the input/output plane 1100 is implemented as an output plane rather than an input plane, the individual cores (1-6) (transporting encoded read data or other outputs) are recouped into a multi-core fiber on the input/output plane 1100.

Although each of the WDMs (e.g., WDM 1106) is shown oriented vertically so as to direct each of the 6 cores output to different column of data blocks in memory, other implementations may implement the WDMs horizontally.

In some implementations, the WDMs on the input/output plane 1100 are tunable so as to allow for dynamic tuning of each input read channel and write channel to account for thermal drift which may cause the WDM to "listen" to slightly different wavelengths at different temperatures. In other implementations, however, the WDMs are not dynamically tunable.

In some implementations, the input/output plane 1100 includes external electrical contacts and elements that all generating the light (for read and write commands, modulating the light (for write commands), and coupling the light to the storage cube. For instance, the input/output plane 1100 may additionally include elements that convert incoming read/write electrical signals to optical signals that are, in turn, routed to the storage cube and/or include elements that convert optical signals output from the storage cube back into electrical signals. In other implementations, this conversion is performed at a location external to the input/output plane 1100.

Figure 12:
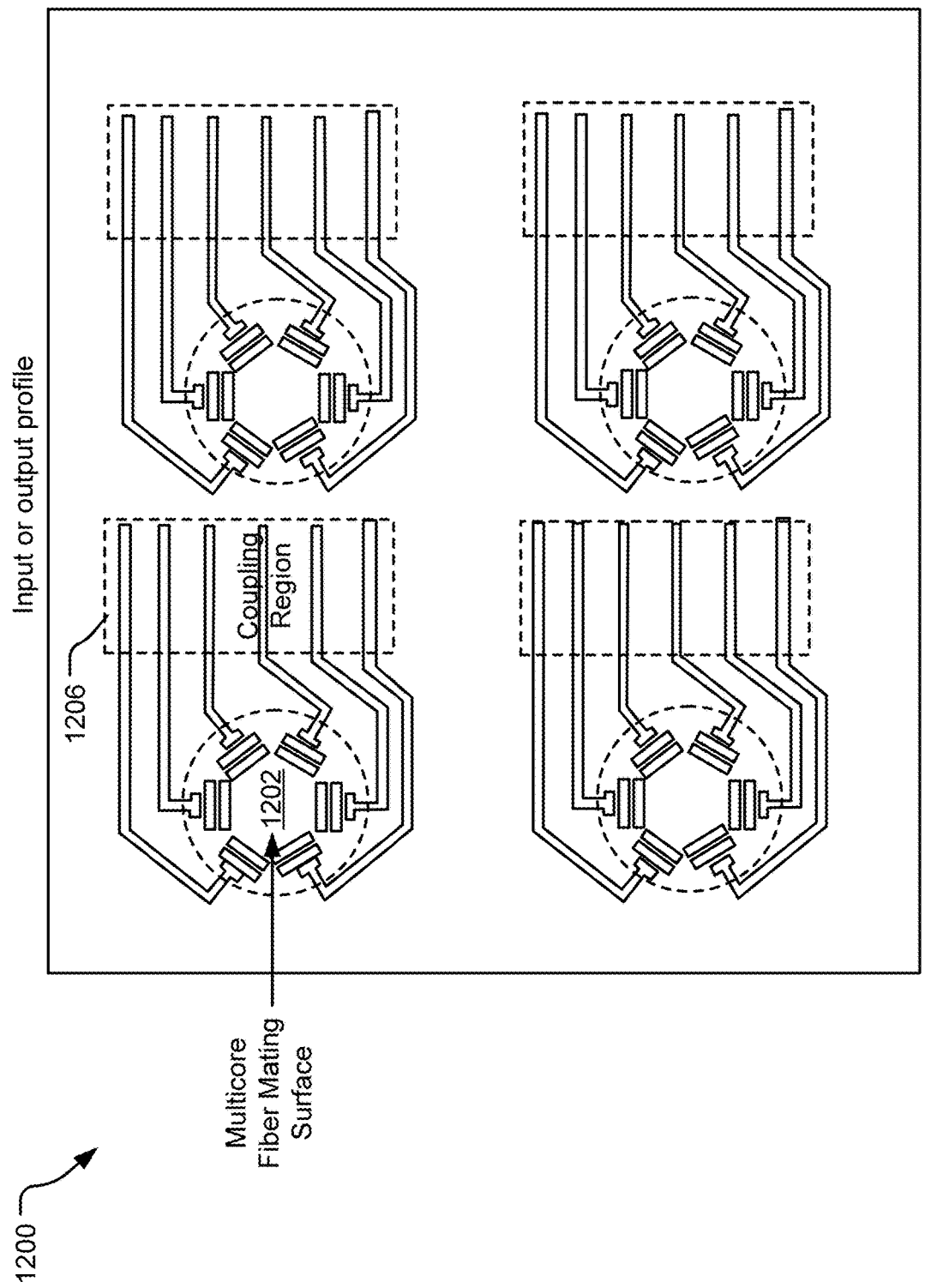
FIG. 12 illustrates an alternate view of components that may be integrated within an input/output plane that may provide inputs to or receive outputs from a scalable storage device.

FIG. 12 illustrates an alternate view of components that may be integrated within an input/output plane 1200, which may be the same or similar to any of the input/output plane 1100 of FIG. 11, the input plane 1002 of FIG. 10, and/or the output plane of FIG. 10. The input/output plane 1200 includes a number of fiber optic couplers (e.g., 1202) that serve as mating surfaces for multicore fibers that supply input signals to or receive output signals from a storage cube. Each fiber optic coupler includes a multiplexing element that that routes each of the different cores along a different waveguide that is then coupled (e.g., in a coupling region 1206) with a different bus waveguide of a storage cube.

Figure 13:
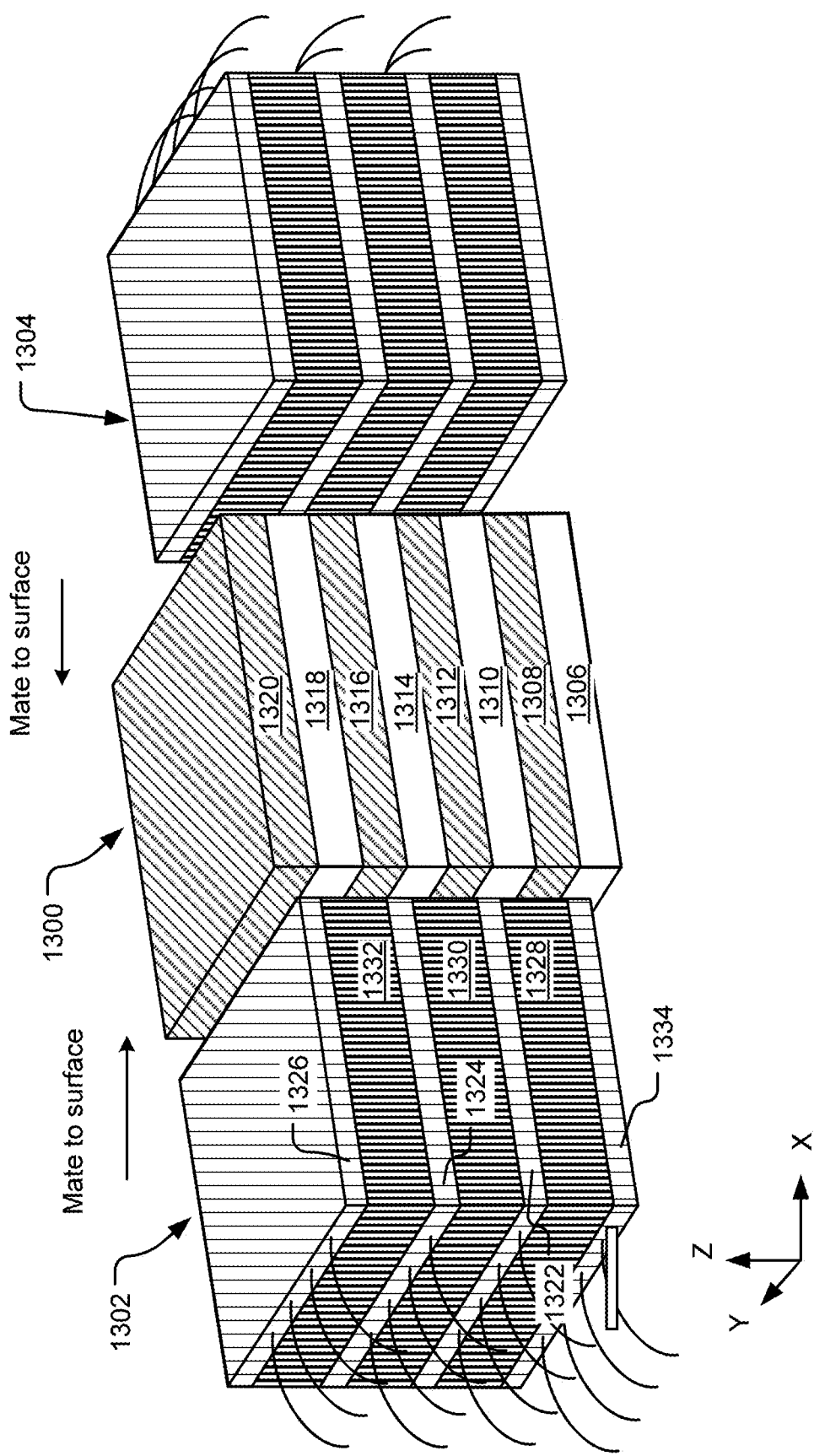
FIG. 13 illustrates still further example optical input/output planes that may provide inputs to or receive outputs from a scalable storage device.

FIG. 13 illustrates still further exemplary optical input/output planes 1302, 1304 that may provide inputs to or receive outputs from a storage cube 1300. The storage cube includes alternating memory layers (memory layers 1308, 1312, 1316, 1320) and optical control layers (1306, 1310, 1314, and 1318). In this implementation, each of the optical input/output planes 1302, 1304 includes a layered stack structure that includes optical transport layers (e.g., optical transport layers 1322, 1324, 1326, 1334) interleaved with actuatable separation layers 1328, 1330, 1332. Each of the actuatable separation layers 1328, 1330, 1332 has a height (z-direction) that can by dynamically adjusted to facilitate precision alignments between each waveguide element within each of the optical transport layers 1322, 1324, 1326, 1334 and a corresponding waveguide element within the associated optical control layers 1306, 1310, 1314, 1318. For example, each of the actuatable separation layers 1328, 1330, 1332 may be controllably expanded or contracted in the Z-direction, such as using piezo electric, thermal expansive/contractive controls, electromagnetic deflection, or other suitable control elements.

Notably, semiconductor manufacturing processes may result in slight variabilities of the layer thicknesses within each individual storage cube. The aforementioned adjustable Z-direction position controls may allow a media player including the optical input/output planes 1302, 1304 to removably coupled to different storage cubes of the same general shape and format despite slight manufacturing variations in the layer thicknesses of those devices. In one such implementation, each storage cube is calibrated during a factory process to identify optical alignment settings that are unique to the layer thicknesses of each individual device. This information is encoded on the storage cube, such as in a bar code, RFID, or layer that is readable without precision alignment such that a media player at a data center can access the encoded information and self-calibrate to facilitate precision alignments between the waveguides of the optical input/output planes 1302, 1304 and the waveguides within the device.

Notably, temperature variability may also affect optical alignments. Therefore, the actuatable separation layers 1328, 1330, 1332 may also allow for dynamic z-direction adjustments to ensure alignments remain precise each time the storage cube is accessed and/or mated with a new media player. These types of Z-direction adjustments may be performed by employing a dynamic geometry reader/writer with feedback to maintain alignment, such as by transmitting a test signal periodically on one or multiple fibers and calculating optical loss at an output point.

In one implementation, the material within each of the actuatable separation layers 1328, 1330, 1332 is not monolithic but instead allows for angling or bending of each layer to better match the storage cube registration. Additionally, a protective layer may be deposited on the storage cube to increase mating cycles.

Figure 14:
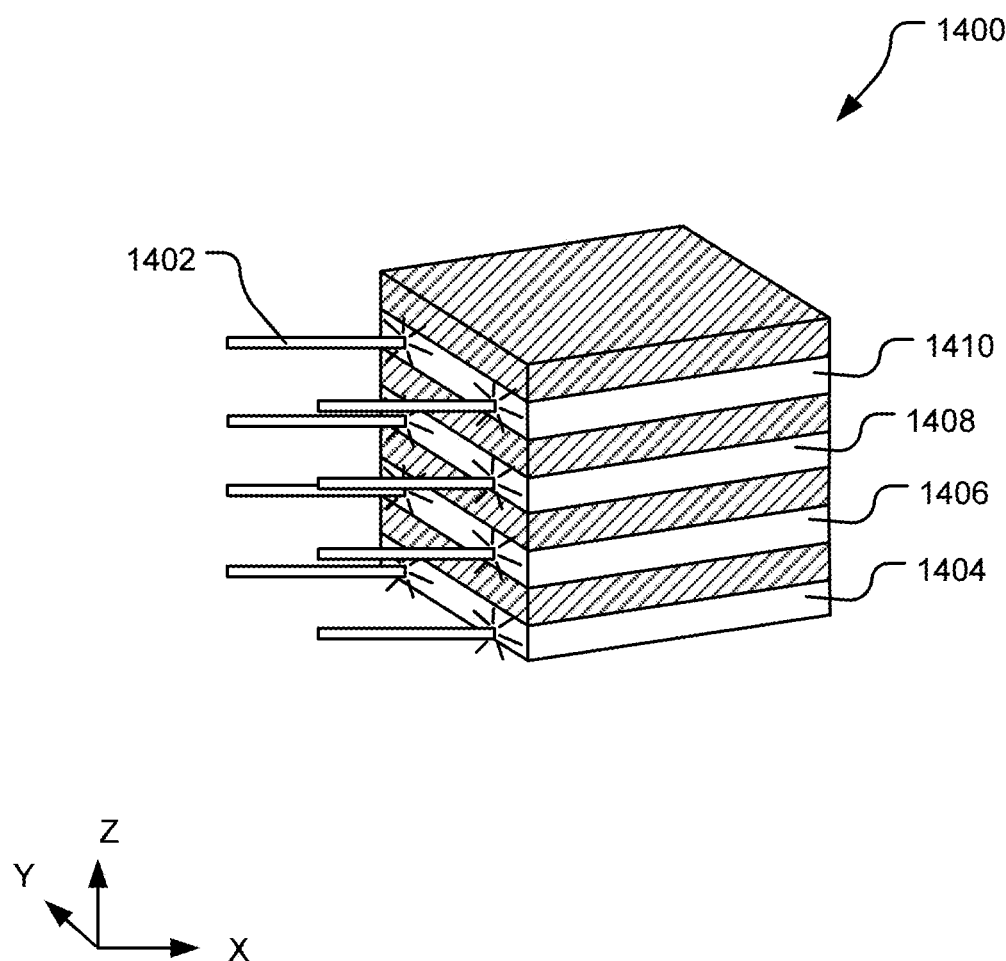
FIG. 14 illustrates an example scalable storage device that utilizes an alternative coupling mechanism to receive optical signals from input/output planes.

FIG. 14 illustrates an example storage cube that utilizes an alternative coupling mechanism to receive optical signals from input/output planes (not shown). In this implementation, graduated index (GRIN) collimators are used to couple one or more free-space optical beams (e.g., laser beam 1402) into respective bus waveguides in one or more optical control layers 1404, 1406, 1408, 1410 of the storage cube, resulting in a more forgiving alignment. One or more lenses may be integrated within the optical control layers to receive and direct the optical beams into the bus waveguide(s).

Figure 15:
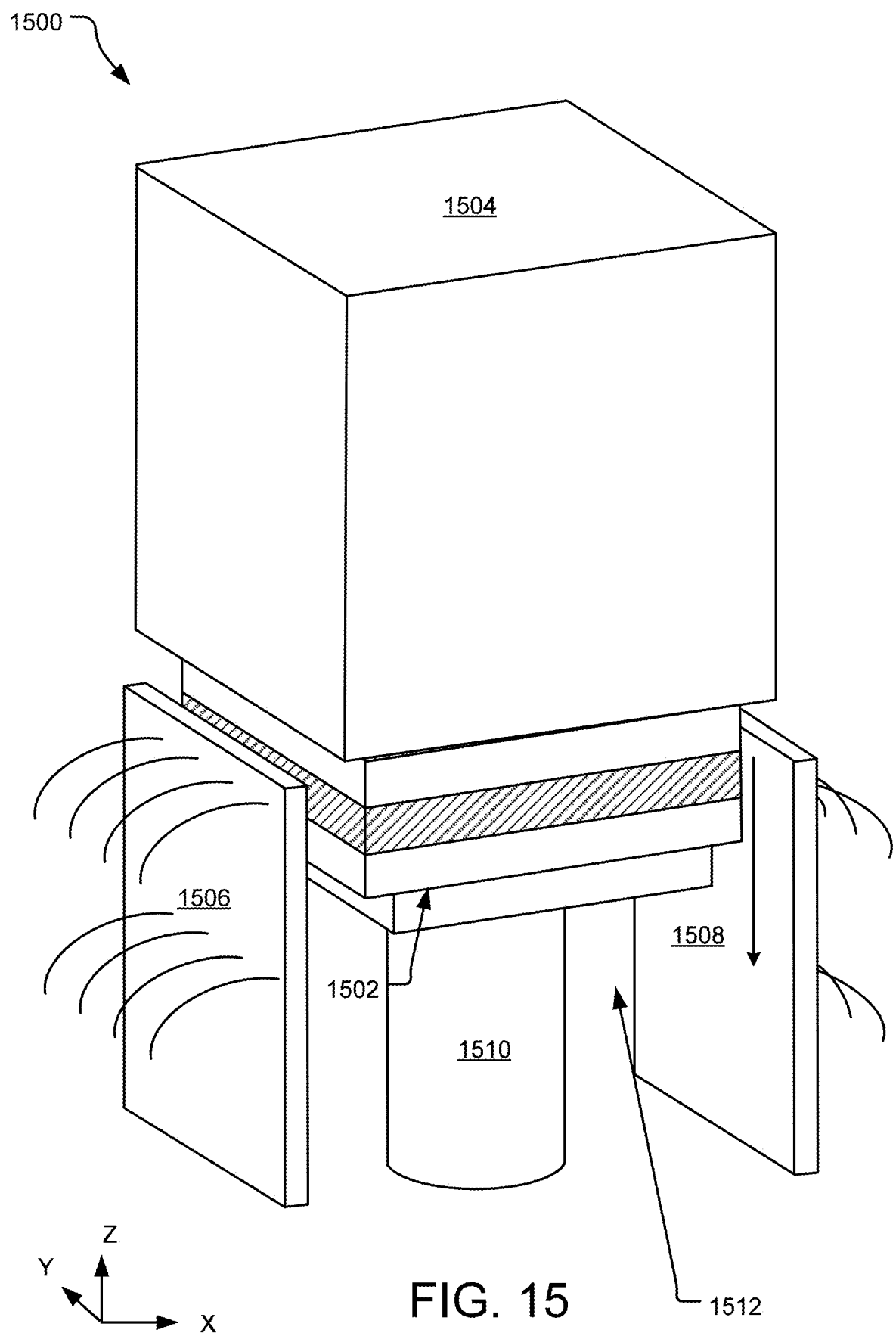
FIG. 15 illustrates aspects of an example system for accessing data on a scalable storage device.

FIG. 15 illustrates aspects of an example system 1500 for accessing data on a storage cube 1502. The storage cube is shown partially internal to a cassette 1504, which is a protective structure in which a storage cube may be stored for transport and when not in use. By example and without limitation, the cassette 1504 is shown to be a cube that surrounds five sides of the storage cube 1502. To perform data access operations on the storage cube, the open end of the cassette 1504 is positioned to face a receiving dock 1512 in a media player. When the cassette 1504 makes contact with a surface of the media player (e.g., such as contact with the top of input/output planes 1506, 1508), the cassette registers/locks into place and drops the storage cube 1502 into the receiving dock. In one implementation, the receiving dock in the media player includes a pedestal 1510 that serves as a landing dock for the storage cube 1502. In some implementations, the pedestal magnetically or mechanically locks to the storage cube 1502 when contact is established. The pedestal is actuated to lower the storage cube into the media player between the input/output planes 1506, 1508.

Figure 16:
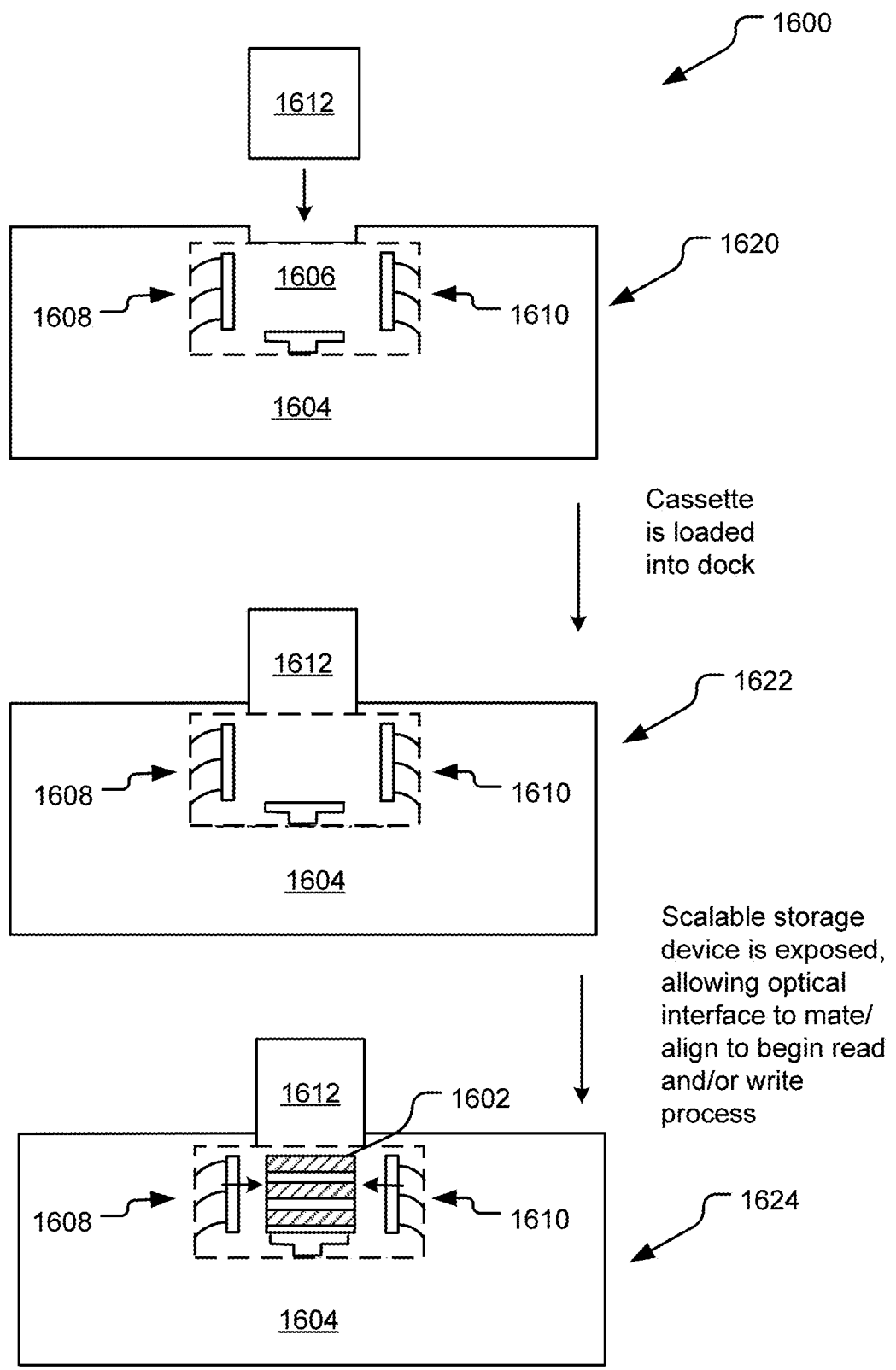
FIG. 16 illustrates further aspects of an example system for accessing data on a scalable storage device.

FIG. 16 illustrates further aspects of an example system 1600 for accessing data on a storage cube 1602. The system includes a media player 1604 with a receiving dock 1606 for receiving the storage cube 1602 from a cassette 1612. The receiving dock 1606 is, for example, a cavity between a pair of input/output planes 1608, 1610 that provide optical inputs to and receive optical inputs from the storage cube 1602. Characteristics of the input/output planes 1608, 1610, cassette 1612, and storage cube 1602 may be the same or similar to other like-named component described herein.

To establish the optical connects for reading data from and writing data to the storage cube 1602, the cassette 1612 is lowered into contact with the media player 1604, as shown by operations 1620 and 1622. When contact is established between the cassette 1612 and the media player 1604, the storage cube is released into the dock 1606, as shown by operation 1624. The input/output planes 1608, 1610 are actuated toward opposing sides of the storage cube 1602 and alignment operations are performed to ensure that optical inputs and output ports on the input/output planes 1608, 1610 are precisely aligned with corresponding waveguides inputs/outputs of the storage cube 1602.

Figure 17:
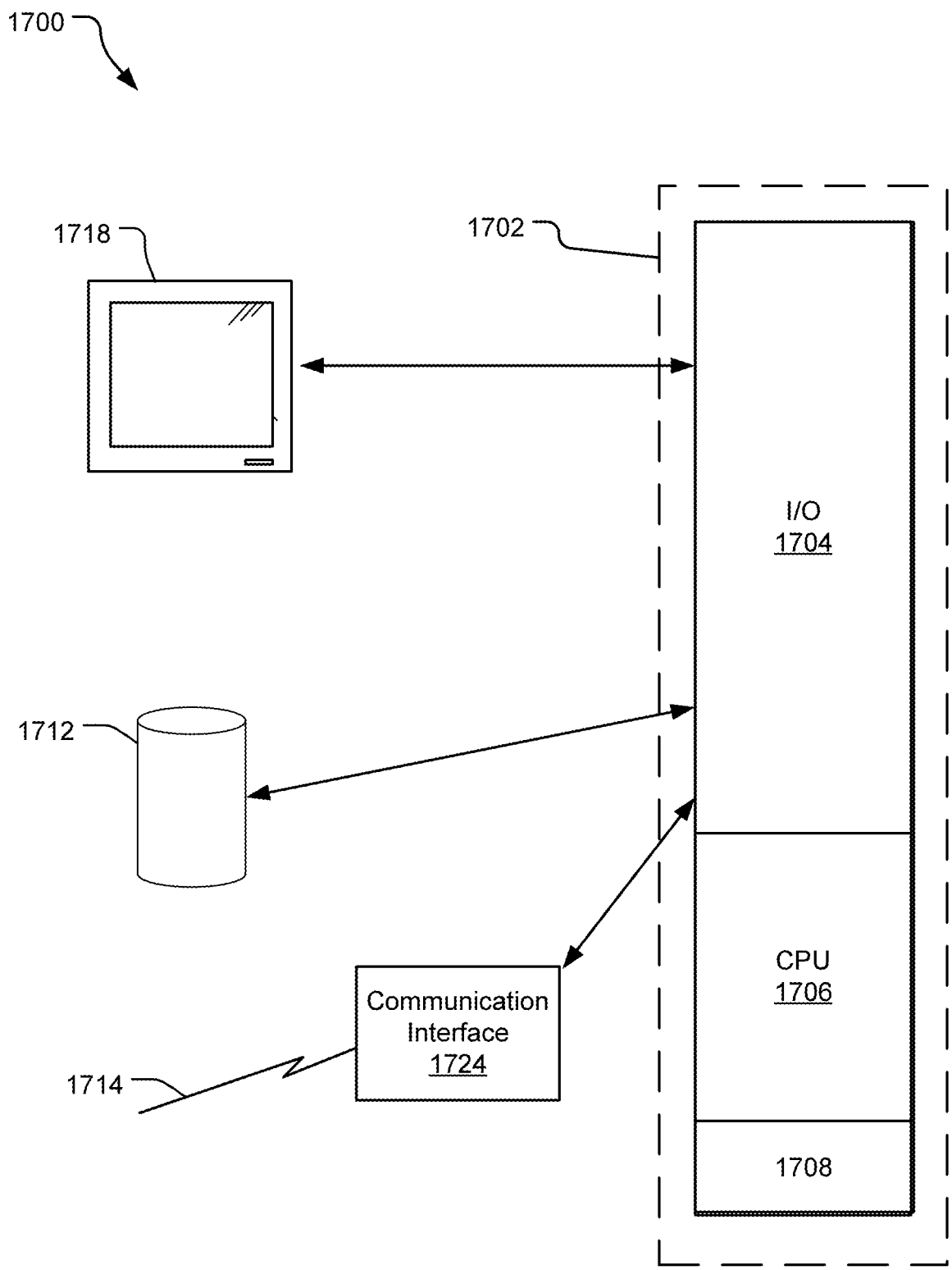
FIG. 17 illustrates an example processing system that may be useful in implementing the disclosed technology.

FIG. 17 illustrates an example processing system 1700 that may be useful in implementing the described technology. The processing system 1700 is capable of executing a computer program product embodied in a tangible computer-readable storage medium to execute a computer process. Data and program files may be input to the processing system 1700, which reads the files and executes the programs therein using one or more processors (CPUs or GPUs). Some of the elements of a processing system 1700 are shown in FIG. 17 wherein a processor 1702 is shown having an input/output (I/O) section 1704, a Central Processing Unit (CPU) 1706, and a memory section 1708. There may be one or more processors 1702, such that the processor 1702 of the processing system 1700 comprises a single central-processing unit 1706, or a plurality of processing units. The processors may be single core or multi-core processors. The processing system 1700 may be a conventional computer, a distributed computer, or any other type of computer. The described technology is optionally implemented in software loaded in memory 1708, a storage unit 1712, and/or communicated via a wired or wireless network link 1714 on a carrier signal (e.g., Ethernet, 3G wireless, 4G wireless, LTE (Long Term Evolution)) thereby transforming the processing system 1700 in FIG. 17 to a special purpose machine for implementing the described operations. The processing system 1700 may be an application specific processing system configured for supporting a distributed ledger. In other words, the processing system 1700 may be a ledger node.

The I/O section 1704 may be connected to one or more user-interface devices (e.g., a keyboard, a touch-screen display unit 1718, etc.) or a storage unit 1712. Computer program products containing mechanisms to effectuate the systems and methods in accordance with the described technology may reside in the memory section 1708 or on the storage unit 1712 of such a system 1700.

A communication interface 1724 is capable of connecting the processing system 1700 to an enterprise network via the network link 1714, through which the computer system can receive instructions and data embodied in a carrier wave. When used in a local area networking (LAN) environment, the processing system 1700 is connected (by wired connection or wirelessly) to a local network through the communication interface 1724, which is one type of communications device. When used in a wide-area-networking (WAN) environment, the processing system 1700 typically includes a modem, a network adapter, or any other type of communications device for establishing communications over the wide area network. In a networked environment, program modules depicted relative to the processing system 1700 or portions thereof, may be stored in a remote memory storage device. It is appreciated that the network connections shown are examples of communications devices for and other means of establishing a communications link between the computers may be used.

In an example implementation, a user interface software module, a communication interface, an input/output interface module, a ledger node, and other modules may be embodied by instructions stored in memory 1708 and/or the storage unit 1712 and executed by the processor 1702. Further, local computing systems, remote data sources and/or services, and other associated logic represent firmware, hardware, and/or software, which may be configured to assist in supporting a distributed ledger. A ledger node system may be implemented using a general-purpose computer and specialized software (such as a server executing service software), a special purpose computing system and specialized software (such as a mobile device or network appliance executing service software), or other computing configurations. In addition, keys, device information, identification, configurations, etc. may be stored in the memory 1708 and/or the storage unit 1712 and executed by the processor 1702.

The processing system 1700 may be implemented in a device, such as a user device, storage device, IoT device, a desktop, laptop, computing device. The processing system 1700 may be a ledger node that executes in a user device or external to a user device.

In addition to methods, the embodiments of the technology described herein can be implemented as logical steps in one or more computer systems. The logical operations of the present technology can be implemented (1) as a sequence of processor-implemented steps executing in one or more computer systems and/or (2) as interconnected machine or circuit modules within one or more computer systems. Implementation is a matter of choice, dependent on the performance requirements of the computer system implementing the technology. Accordingly, the logical operations of the technology described herein are referred to variously as operations, steps, objects, or modules. Furthermore, it should be understood that logical operations may be performed in any order, unless explicitly claimed otherwise or unless a specific order is inherently necessitated by the claim language.

Data storage and/or memory may be embodied by various types of processor-readable storage media, such as hard disc media, a storage array containing multiple storage devices, optical media, solid-state drive technology, ROM, RAM, and other technology. The operations may be implemented processor-executable instructions in firmware, software, hard-wired circuitry, gate array technology and other technologies, whether executed or assisted by a microprocessor, a microprocessor core, a microcontroller, special purpose circuitry, or other processing technologies. It should be understood that a write controller, a storage controller, data write circuitry, data read and recovery circuitry, a sorting module, and other functional modules of a data storage system may include or work in concert with a processor for processing processor-readable instructions for performing a system-implemented process.

For purposes of this description and meaning of the claims, the term "memory" means a tangible data storage device, including non-volatile memories (such as flash memory and the like) and volatile memories (such as dynamic random-access memory and the like). The computer instructions either permanently or temporarily reside in the memory, along with other information such as data, virtual mappings, operating systems, applications, and the like that are accessed by a computer processor to perform the desired functionality. The term "memory" expressly does not include a transitory medium such as a carrier signal, but the computer instructions can be transferred to the memory wirelessly.

The above specification, examples, and data provide a complete description of the structure and use of example embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A storage device comprising:
    a layer stack including at least:
        a memory layer including a plurality of memory cells; and
        an optical control layer positioned adjacent to the memory layer in the layer stack, the optical control layer being adapted to receive and transmit optically-encoded read/write signals and effect read and write operations to the plurality of memory cells through an electrical interface; and
        a plurality of wave division multiplexers (WDMs) each being positioned to couple optical signals delivered by a bus waveguide to a respective optical-electrical conversion element coupled to the memory layer, the plurality of WDMs including:
            a first subset of WDMs dedicated to transporting write signals from the optical control layer to the memory layer; and
            a second subset of WDMs dedicated to transporting read signals from the memory layer to the optical control layer, each of the WDMs in the first subset and in the second subset being tuned for operation at a different wavelength to collectively support parallel transport of multiple read streams and multiple write streams within the bus waveguide.

2. The storage device of claim 1, wherein the optical control layer further comprises:
    a bus waveguide, wherein each of the WDMs is positioned to couple optical signals delivered by the bus waveguide to a respective optical-electrical conversion element coupled to the memory layer.

3. The storage device of claim 1, wherein the optical control layer further comprises multiple bus waveguides, the multiple bus waveguides collectively adapted to transport different optical signals to different regions of the memory layer to effect parallel data access operations to the memory layer.

4. The storage device of claim 1, wherein the layer stack includes multiple memory layers interleaved between multiple optical control layers, each one of the optical control layers being adapted to independently read and write to a different one of the memory layers.

5. The storage device of claim 4, wherein each of the optical control layers includes at least one bus waveguide and the storage device further is further adapted to couple optical signals between different bus waveguides in adjacent optical control layers of the layer stack to effect parallel data access operations within different memory layers of the layer stack using a same optical signal stream.

6. A storage system comprising:
    a portable storage device including:
        at least one memory layer having a plurality of memory cells; and
        at least one optical control layer adjacent to the at least one memory layer, the optical control layer including a bus waveguide that delivers optically-encoded read/write signals to control circuitry that effects read and write operations to the plurality of memory cells through an electrical interface;
        a plurality of wave division multiplexers (WDMs) each being positioned to couple optical signals delivered by a bus waveguide to a respective optical-electrical conversion element coupled to the memory layer, the plurality of WDMs including:
            a first subset of WDMs dedicated to transporting write signals from the optical control layer to the memory layer;
            a second subset of WDMs dedicated to transporting read signals from the memory layer to the optical control layer, each of the WDMs in the first subset and in the second subset being tuned for operation at a different wavelength to collectively support parallel transport of multiple read streams and multiple write streams within the bus waveguide.

7. The storage system of claim 6, further comprising:
    a dock adapted to receive the portable storage device, the dock including at least:

an input plane including one or more fiber optic lines adapted to deliver the optically-encoded read/write signals to the bus waveguide; and an output plane including one or more fiber optic lines adapted to receive outgoing signals from the bus waveguide.

8. The storage system of claim 6, wherein the at least one memory layer and the at least one optical control layer of the portable storage device are included in a layer stack comprising multiple memory layers interleaved between multiple optical control layers, each one of the optical control layers being adapted to independently read and write to a different one of the memory layers.

9. The storage system of claim 8, wherein each of the optical control layers includes at least one bus waveguide and the portable storage device is adapted to transport optical signals between the bus waveguides in adjacent optical control layers to effect parallel data access operations within different memory layers using a same optical signal stream.

10. The storage system of claim 6, further comprising:
a dock adapted to receive the portable storage device, the dock including:
a stack of optical input/output planes, each optical input/output plane including optical signal transport elements adapted to transport the optically-encoded read/write signals to or from an associated one of the optical control layers; and
multiple separation layers each individually being interleaved between a pair of the optical input/output planes in the stack, each of the separation layers having a tunable thickness that facilitates positional adjustments to the optical input/output planes to provide for adjustable precision alignment between each of the optical input/output planes and the associated one of the optical control layers in the portable storage device.

11. The storage system of claim 6, wherein each of the plurality of wave division multiplexers (WDM) is positioned to couple optical signals delivered by the bus waveguide to a respective optical-electrical conversion element electrically coupled to the memory layer.

12. The storage system of claim 6, wherein storage device includes at least a first bus waveguide dedicated to transport of read signals and read data and a second bus waveguide dedicated to transport of write signals and write data.

13. The storage system of claim 6, wherein the bus waveguide transports optical signals encoding both read data and write data in a same optical signal stream.

14. A storage system comprising:
a portable storage device including:
at least one memory layer having a plurality of memory cells; and
at least one optical control layer adjacent to the at least one memory layer, the optical control layer including a bus waveguide that delivers optically-encoded read/write signals to control circuitry that effects read and write operations to the plurality of memory cells through an electrical interface;
a dock adapted to receive the portable storage device, the dock including:
a stack of optical input/output planes, each optical input/output plane including optical signal transport elements adapted to transport the optically-encoded read/write signals to or from an associated one of the optical control layers; and
multiple separation layers each individually being interleaved between a pair of the optical input/output planes in the stack, each of the separation layers having a tunable thickness that facilitates positional adjustments to the optical input/output planes to provide for adjustable precision alignment between each of the optical input/output planes and the associated one of the optical control layers in the portable storage device.

* * * * *